United States Patent
Sasayama

(10) Patent No.: US 6,866,432 B2
(45) Date of Patent: Mar. 15, 2005

(54) METHOD FOR REPLENISHING DEVELOPER OF AUTOMATIC DEVELOPING APPARATUS FOR PHOTOSENSITIVE LITHOGRAPHIC PRINTING PLATE

(75) Inventor: Hiroyuki Sasayama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/752,991

(22) Filed: Jan. 8, 2004

(65) Prior Publication Data

US 2004/0165882 A1 Aug. 26, 2004

(30) Foreign Application Priority Data

Jan. 9, 2003 (JP) ..................................... P.2003-003293

(51) Int. Cl.[7] ............................ G03D 3/02; G03D 13/00
(52) U.S. Cl. ........................ 396/571; 396/578; 396/626; 430/30
(58) Field of Search ................................ 396/571, 578, 396/626; 355/27–29, 77; 430/30; 134/64 P, 64 R, 122 P, 122 R

(56) References Cited

U.S. PATENT DOCUMENTS 4,882,246 A * 11/1989 Ohba et al. ................. 396/571
5,223,881 A * 6/1993 Nakagawa et al. ......... 396/570
5,701,542 A * 12/1997 Sasayama ................... 396/578
5,716,743 A * 2/1998 Stein et al. ................. 396/571
6,364,544 B1 * 4/2002 Sasayama et al. .......... 396/578

FOREIGN PATENT DOCUMENTS

JP          64-21451 A      1/1989
JP          9-96910 A       4/1997

* cited by examiner

Primary Examiner—D. Rutledge
(74) Attorney, Agent, or Firm—Sughrue Mion, PLLC

(57) ABSTRACT

In an electric conductivity-based replenishing system, a developer replenishing method for a photosensitive lithographic printing plate is provided which is capable of minimizing the fluctuations in sensitivity of a developer with respect to the changes in development treatment conditions. An electric conductivity value of the developer is measured in a predetermined given cycle, when the measured electric conductivity value of the developer is lower than the target electric conductivity value, the developer is replenished with a predetermined amount of a developer replenisher, the time interval between the previous supply of the developer replenisher and the present supply of the developer replenisher is measured, a target electric conductivity arithmetic expression is selected based on the measured replenishment time interval and the replenishment time interval threshold value. Using the selected target electric conductivity value arithmetic expression and the measured replenishment time interval, the target electric conductivity value is updated.

7 Claims, 3 Drawing Sheets

METHOD FOR REPLENISHING DEVELOPER OF AUTOMATIC DEVELOPING APPARATUS FOR PHOTOSENSITIVE LITHOGRAPHIC PRINTING PLATE

FIELD OF THE INVENTION

The invention relates to a developer replenishing method of, for example, an automatic developing apparatus for photosensitive lithographic printing plates. More particularly, it relates to a technique for minimizing the fluctuations in developer sensitivity with respect to changes in development treatment conditions.

BACKGROUND OF THE INVENTION

In general, as a technique of controlling the sensitivity of a developer in an automatic developing apparatus for photosensitive lithographic printing plates, there is adopted a time- and treatment-based replenishing method of a developer replenisher (hereinafter, referred to as an "area- and time-based replenishing method") in which a developer tank storing a developer therein is replenished with a developer replenisher with time, and the plate area of a lithographic printing plate to be treated is measured, so that the tank is replenished with the developer replenisher in an amount corresponding to the measured value.

However, with such an area- and time-based replenishing method, a plate area measuring device of a lithographic printing plate becomes necessary at a development treatment unit of the automatic developing apparatus, unfavorably resulting in a more complicated structure, and incurring a high cost. Further, it is difficult to determine whether the lithographic printing plate has only a single-sided or double-sided photosensitive layers (hereinafter, referred to as "single sided/double sided"), and to determine the plate types (of the plates mutually different in coating amount of the photosensitive layer, or the like). For this reason, when the required replenishing amount of the developer replenisher is changed due to the changes in the plate area, single sided/double sided, or the plate type of the lithographic printing plate, unfavorably, it becomes difficult to properly carry out the supply of the developer replenisher.

Under such circumstances, conventionally, for example, as described in Japanese Patent No. 2516022 (JP-A-64-21451; the term "JP-A" as used herein means an "unexamined published Japanese patent application), as a developer replenisher supply method of an automatic developing apparatus for photosensitive lithographic printing plates, there has been adopted a replenishing method (hereinafter, referred to as an "electric conductivity-based replenishing method") as follows: the electric conductivity of the developer is measured, and the measured value is compared with the electric conductivity value experimentally determined in advance, indicative of the optimum sensitivity (hereinafter, referred to as a "proper electric conductivity value"); when the measured value falls short of the proper electric conductivity value, the developer replenisher is supplied. With such an electric conductivity-based replenishing method, even when the plate area, single sided/double sided, or the plate type of the lithographic printing plate to be treated changes, it is possible to carry out the supply of the developer replenisher in a proper amount, and it is possible to keep the sensitivity of the developer proper.

However, in general, there is the empirical fact that the developer fatigued with only a carbonic acid gas over time and the developer fatigued with only the plate treatment have mutually different proper electric conductivity values (silicate type treating agent/when recovered by replenishment from fatigue over time (carbonic acid gas fatigue): 65 mS/cm, when recovered by replenishment from treatment fatigue: 55 mS/cm, non-silicate type treating agent/when recovered by replenishment from fatigue over time: 56 mS/cm, when recovered by replenishment from treatment fatigue: 39 mS/cm). For this reason, with the foregoing electric conductivity-based replenishing method, when the treatment frequency, for example, the treatment amount per day is different from the expected amount, there is also a discrepancy between the ratio of the actual time-based replenishing amount and the treatment-based replenishing amount and the expected value. Therefore, the proper electric conductivity value of the developer calculated from each proper electric conductivity changes. As a result, a discrepancy from the preset proper electric conductivity value is caused, so that unfavorably it becomes impossible to keep the developer sensitivity proper.

In contrast, JP-A-9-96910 proposes an automatic developing apparatus as follows. The replenishment time interval is measured, and the time-based replenishing amount considered to be required within the time interval is determined. The determined time-based replenishing amount is subtracted from the replenishing amount per step. The calculated value is taken as a treatment-based replenishing amount. Thus, the treatment-based replenishing amount and the time-based replenishing amount are respectively determined. Then, the ratio between the obtained treatment-based replenishing amount and time-based replenishing amount is calculated to correct the target electric conductivity value. With this technique, even when the plate area, single sided/double sided, or the plate type of a lithographic printing plate to be treated changes, it is possible to identify the proper target electric conductivity value with precision by estimating the ratio between the treatment-based replenishing amount and the time-based replenishing amount.

However, with the foregoing method for determining the ratio between the treatment-based replenishing amount and the time-based replenishing amount from the replenishment time interval, and correcting the target electric conductivity value, there occurs a problem that it is not possible to determine the precise ratio between the treatment-based replenishing amount and the time-based replenishing amount in the case where the aging exhaustion conditions are different. The case where the time-based conditions are different includes, for example, the case where the carbonic acid gas concentration of the ambient atmosphere has changed, or the case where the reactivity of the carbonic acid gas with a developer has changed. The following facts are known. For the former case, the value changes depending upon the number of workers in a room where an automatic developing apparatus is set. Whereas, for the latter case, it changes depending upon whether the automatic developing apparatus is operating or stopping. In other words, with the foregoing method, a discrepancy arises between the experimentally predetermined time-based replenishing amount on a unit time basis and the actual time-based replenishing amount on a unit time basis depending upon the fluctuations in number of indoor workers, or depending upon whether the automatic developing apparatus has been operating or stopping. For this reason, it is not possible to determine the precise time-based replenishing amount from the replenishment time interval. This causes a fear that an erroneous target electric conductivity value is calculated.

In view of such circumstances, it is therefore an object of the invention to provide a developer replenishing method of an automatic developing apparatus for photosensitive lithographic printing plates, capable of minimizing the fluctuations in developer sensitivity with respect to the changes in development treatment conditions while implementing a developing unit of the automatic developing apparatus in a simple and low cost structure in an electric conductivity-based replenishing method.

SUMMARY OF THE INVENTION

The foregoing object of the invention is achieved by the following constitution.

1. A method for replenishing a developer of an automatic developing apparatus for photosensitive lithographic printing plates, the method comprising: developing a plurality of photosensitive lithographic printing plates subjected to an image exposure with a developer containing an electrolyte, while measuring an electric conductivity value of the developer; and keeping the developer activity constant in accordance with the measured electric conductivity value of the developer, wherein the method comprises:

preliminarily storing: an electric conductivity value of the developer having a developer activity falling within a proper range as a target electric conductivity value; a plurality of target electric conductivity arithmetic expressions set according to different aging exhaustion conditions; and threshold values of replenishment time interval for determining the target electric conductivity arithmetic expressions;

measuring the electric conductivity value of the developer in a predetermined cycle;

replenishing the developer with a predetermined amount of a developer replenisher when the measured electric conductivity value of the developer is lower than the target electric conductivity value; and measuring the replenishment time interval between the previous replenishment of the developer replenisher and the present replenishment of the developer replenisher;

selecting one of the target electric conductivity arithmetic expressions based on the measured replenishment time interval and the threshold value of replenishment time interval; and updating the target electric conductivity value based on the selected target electric conductivity arithmetic expression and the measured replenishment time interval.

2. The method according to the item 1, wherein the electric conductivity value is measured with a measuring device equipped with a temperature sensor and a temperature compensating circuit.

3. The method according to the items, wherein the developer electric conductivity value at the time of first start of the treatment of the automatic developing apparatus is stored as a target electric conductivity value of a developer having an activity within a proper range.

4. The method according to item 1, wherein one of the target electric conductivity arithmetic expressions is selected, based or the relative magnitudes of the measured replenishment time interval and threshold value of replenishment time interval.

5. The method according to the item 1, wherein a first threshold value Ts1 of replenishment time interval and a second threshold value Ts2 of replenishment time interval are preliminarily stored, and when the measured replenishment time interval T from the previous replenishment is smaller than the first threshold value Ts1 of replenishment time interval., new target electric conductivity value is calculated and updated by a first arithmetic expression expressed by the following equation (1):

$$dn = C1 \times do + C2 \times T + C3 \qquad (1)$$

do: Target electric conductivity value before replenishment,
dn: New target electric conductivity value,
T: Replenishment time interval measured,
C1, C2, and C3: Preliminary experimentally set constant.

6. The method according to the item 5, wherein, when the measured replenishment time interval T from the previous replenishment is larger than the first threshold value Ts1 of replenishment time and is smaller than the second threshold value Ts2 of replenishment time interval, new target electric conductivity value is calculated and updated by a second arithmetic expression expressed by the following equation (2):

$$dn = C4 \times do + C5 \times T + C6 \qquad (2)$$

do: Target electric conductivity value before replenishment,
dn: New target electric conductivity value,
T: Replenishment time interval measured,
C4, C5, and C6: Preliminary experimentally set constant.

7. The method according to the item 6, wherein, when the measured replenishment time interval T from the previous replenishment is larger than the first threshold value Ts1 of replenishment time and the second threshold value Ts2 of replenishment time interval, new target electric conductivity value is calculated and updated by a third arithmetic expression expressed by the following equation (3):

$$dn = C7 \times do + C8 \qquad (3)$$

do: Target electric conductivity value before replenishment,
dn: New target electric conductivity value,
C7 and C8: Preliminary experimentally set constant.

DESCRIPTION OF REFERENCE NUMERALS AND SIGNS

Figure 1:
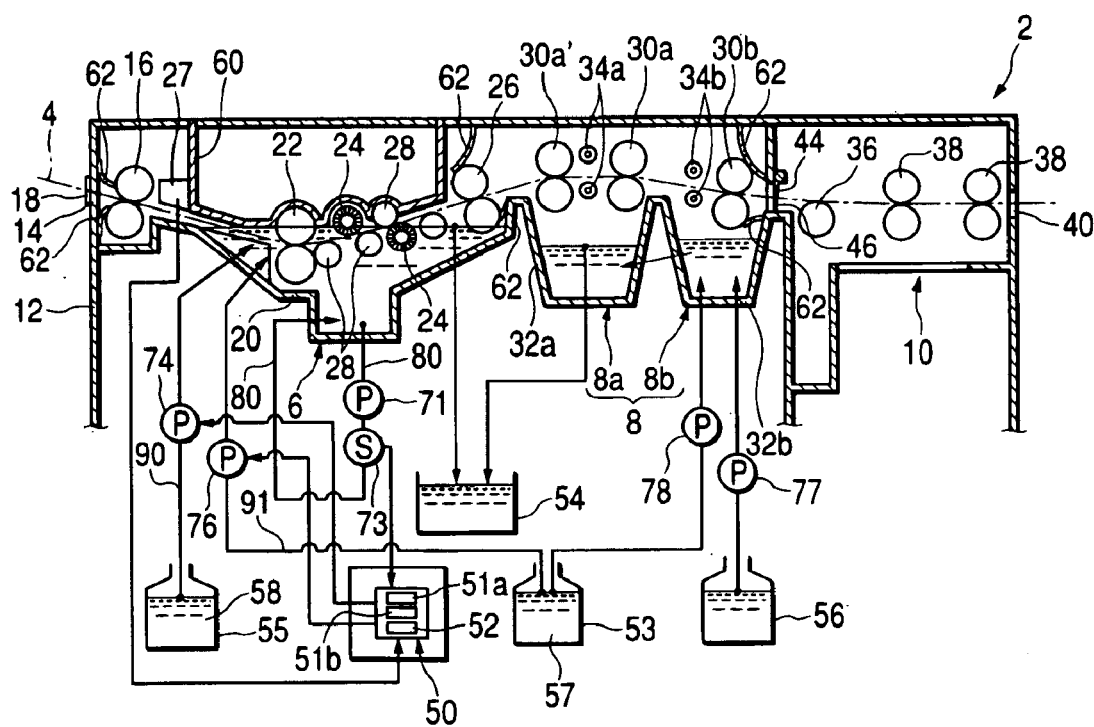
FIG. 1 is a view showing a configuration of a first embodiment of an automatic developing apparatus for carrying out a developer replenishing method of the invention.

2, 100 Automatic developing apparatus
4, 112 PS plate
6, 122 Developing unit
20, 118 Developer tank
50 Controller
51a Control ROM
51b Control RAM
52 Time measuring unit
53 Replenisher diluent storage tank
55, 266 Undiluted replenisher storage tank
73, 262 Electric conductivity sensor
74, 264 Undiluted replenisher supply pump
76 Replenisher diluent supply pump
90, 91 Replenishing pipe

DETAILED DESCRIPTION OF THE INVENTION

In the invention, the "developer replenisher" denotes a treating solution to be supplied for keeping the development performance constant. In general, as the replenishers, there are used the one prepared by diluting an undiluted replenisher with a diluent (e.g., water), and the undiluted replenisher as it is without being diluted. In the invention, the "developer replenisher" denotes the one prepared by diluting an undiluted replenisher with a diluent. Whereas, supply thereof is accomplished in the following manner. A replenisher previously prepared in a diluted form is supplied to a developer. Alternatively, the undiluted replenisher and the diluent are directly supplied to the developer, separately.

Whereas, the electric conductivity sensors for measuring the electric conductivity value of the developer, usable in the invention, are known means such as an AC conductivity meter, an AC bridge meter, or other electric conductivity meters. Further, although the optimum conditions for a measured current value, an oscillating frequency, or the like of the measuring device differ according to the composition of the developer, and the like. However, in terms of device and prevention of the electrolysis of the aqueous developer, the current value is preferably low to some extent, that is, from several hundred mA to several $\mu$A. Whereas, the frequency is preferably from several hundred Hz to several hundred kHz in terms of the relationship with the electrostatic capacity component in the developer.

The electric conductivity value of the developer containing electrolytes depends upon the temperature of the aqueous solution, and the value decreases with an increase in solution temperature. Therefore, more preferably, it is preferable to measure the electric conductivity value with a measuring device equipped with a temperature sensor and a temperature compensating circuit. Further, with a controller for controlling the replenishment, it is also possible to carry out the calculation in terms of the electric conductivity value at a preset temperature based on the actually measured solution resistance value and solution temperature for temperature compensation. The AC conductivity meter, the AC bridge meter, or other electric conductivity meters may be placed at any position so long as the position is such that the meter can be immersed in a developer during measurement to measure the AC electric conductivity value of the developer. For example, the sensor is preferably placed inside a developer circulation system of the automatic developing apparatus, particularly, in a developer tank or in a circulation pipe. Further, as a detection unit, a well-known measuring cell using platinum, stainless steel, or the like, for electrodes is usable.

Then, a developer and a developer replenisher usable in the invention will be described.

1. Developer and developer replenisher [alkali agent] A developer and a developer replenisher usable in the invention are alkali aqueous solutions with a pH of 9.0 to 13.5, and more preferably 10.0 to 13.3. As such developers and developer replenishers, conventionally known alkali aqueous solutions are usable. Examples thereof may include: inorganic alkali agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide. Whereas, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also usable.

Out of these alkali agents, an aqueous solution of silicate, such as sodium silicate or potassium silicate is preferred. The reason for this is that the aqueous solution can be controlled in pH and developability by the ratio of silicone oxide $SiO_2$ as a component of the silicate to the alkali metal oxide $M_2O$ (generally expressed in terms of the molar ratio of $[SiO_2]/[M_2O]$), and the concentrations thereof. For example, an alkali metal silicate comprising an aqueous solution of potassium silicate having an $SiO_2/K_2O$ molar ratio of 0.5 to 2.0 (i.e., $[SiO_2]/[K_2O]$ being 0.5 to 2.0) and an $SiO_2$ content of 1 to 4 mass %, is preferably used in the invention.

As another preferred alkali agent, mention may be made of a buffer solution comprising a weak acid and a strong base. As the weak acids for use as such a buffer solution, those having an acid dissociation constant (pKa) of 10.0 to 13.3 are preferred, and particularly, those having a pKa of 11.0 to 13.1 are preferred. Whereas, for example, for sulfosalicylic acid, the third dissociation constant is 11.7, and it can be preferably used in the invention. Namely, for polybasic acids, any of the polybasic acids are usable in the invention so long as at least one acid dissociation constant thereof falls within the foregoing range.

Such weak acids are selected from the ones described in *IONIZATION CONSTANTS OF ORGANIC ACIDS IN AQUEOUS SOLUTION*, issued by Pergamon Press Co., and the like. Examples thereof may include weak acids including alcohols such as 2,2,3,3-tetrafluoropropanol-1 (pKa 12.74), trifluoroethanol (pKa 12.37), and trichloroethanol (pKa 12.24), aldehydes such as pyridine-2-aldehyde (pKa 12.68) and pyridine-4-aldehyde (pKa 12.05), saccharides such as sorbitol (pKa 13.0), saccharose (pKa 12.7), 2-deoxyribose (pKa 12.61), 2-deoxyglucose (pKa 12.51), glucose (pKa 12.46), galactose (pKa 12.35), arabinose (pKa 12.34), xylose (pKa 12.29), fructose (pKa 12.27), ribose (pKa 12.22), mannose (pKa 12.08), and L-ascorbic acid (pKa 11.34), compounds having phenolic hydroxyl groups such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxybenzenesulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), and resorcinol (pKa 11.27), oximes such as 2-butanone oxime (pKa 12.45), acetoxime (pKa 12.42), 1,2-cycloheptanedionedioxime (pKa 12.3), 2-hydroxybenzadehyde oxime (12.10), dimethylglyoxime (pKa 11.9), ethanediamidedioxime (pKa 11.37), and acetophenone oxime (pKa 11.35), amino acids such as 2-quinolone (pKa 11.76), 2-pyridone (pKa 11.65), 4-quinolone (pKa 11.28), 4-pyridone (pKa 11.12), 5-amino valeric acid (pKa 10.77), 2-mercaptoquinoline (pKa 10.25), and 3-aminopropionic acid (pKa 10.24), nucleic acid-related compounds such as fluorouracil (pKa 13.0), guanosine (pKa 12.6), uridine (pKa 12.6), adenosine (pKa 12.56), inosine (pKa 12.5), guanine (pKa 12.3), cytisine (pKa 12.2), cytosine (pKa 12.2), hypoxanthine (pKa 12.1), and xanthine (pKa 11.9), and other weak acids such as diethylaminomethyl phosphonic acid (pKa 12.32), 1-amino-3,3,3-trifluorobenzoic acid (pKa 12.29), isopropylidenediphosphonic acid (pKa 12.10), 1,1-ethylidenediphosphonic acid (pKa 11.54), 1,1-ethylidenediphosphonic acid-1-hydroxy (pKa 11.52), benzimidazole (pKa 12.86), thiobenzamide (pKa 12.8), picolinethioamide (pKa 12.55), and barbituric acid (pKa 12.5).

As the strong bases to be combined with the weak acids, sodium hydroxide, ammonium hydroxide, potassium hydroxide, and lithium hydroxide are used. These alkali agents may be used alone or in combination of two or more thereof. Out of these alkali buffer agents, preferable ones are the combinations of either of sulfosalicylic acid, salicylic acid, saccharose, and sorbitol with either of sodium hydroxide and potassium hydroxide. Especially preferred combination is that of sorbitol with potassium hydroxide or sodium hydroxide. The foregoing various alkali agents are controlled in pH within a preferred range by the concentration and the combination, and used.

[Surfactants]

To a developer and a replenisher for use in the invention, various surfactants and organic solvents can be added, if required, for the purposes of promoting the developability, dispersing the development residue, and enhancing the affinity of the printing plate image portions for ink. The surfactants are preferably anionic, cationic, nonionic, and amphoteric surfactants.

Preferred examples of the surfactants may include nonionic surfactants such as polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenized caster oils, polyoxyethylene glycerol fatty acid partial esters, fatty acid diethanolamides, N,N-bis-2-hydroxyalkylamines, polyoxyethylene alkylamines, triethanblamine fatty acid esters, and trialkylamine oxides; anionic surfactants such as fatty acid salts, abietates, hydroxyalkane sulfonates, alkanesulfonates, dialkylsulfosuccinic ester salts, straight chain alkylbenzenesulfonates, branched chain alkylbenzenesulfonates, alkylnaphthalenesulfonates, alkylphenoxypolyoxyethylene propylsulfonates, polyoxyethylene alkylsulfophenyl ether salts, N-methyl-N-oleyltaurinesodiumsalt, N-alkylsulfosuccinicacid monoamlde disodium salts, petroleum sulfonic acid salts, sulfated tallow, sulfate salts of fatty acid alkyl esters, alkylsulfate salts, polyoxyethylene alkyl ether sulfate salts, fatty acid monoglyceride sulfate salts, polyoxyethylene alkyl phenyl ether sulfate salts, polyoxyethylene styryl phenyl ether sulfate salts, alkyl phosphate salts, polyoxyethylene alkyl ether phosphate salts, polyoxyethylene alkyl phenyl ether phosphate salts, partially saponified products of styrene/maleic anhydride copolymers, partially saponified products of olefin/maleic anhydride copolymers, and formalin-condensates of naphthalene sulfonates; cationic surfactants such as alkylamine salts, quaternary ammonium salts such as tetrabutylammonium bromide, polyoxyethylenealkylamine salts, and polyethylene polyamine derivatives; and amphoteric surfactants such as carboxybetaines, aminocarboxylic acids, sulfobetaines, aminosulfates, and imidazolines. In the surfactants mentioned above, the term "polyoxyethylene" can also be read as "polyoxyalkylene" such as polyoxymethylene, polyoxypropylene, or polyoxybutylene, and the surfactants thereof are also included in the scope of the invention.

Further preferred surfactants are fluorine-containing surfactants containing perfluoroalkyl groups in their molecules. Examples of such fluorine-containing surfactants may include anionic ones such as perfluoroalkylcarboxylates, perfluoroalkylsulfonates, and perfluoroalkylphosphates; amphoteric ones such as perfluoroalkylbetaines; cationic ones such as perfluoroalkyl trimethyl ammonium salts; and nonionic ones such as perfluoroalkylamine oxides, perfluoroalkyl ethylene oxide adducts, oligomers containing perfluoroalkyl groups and hydrophilic groups, oligomers containing perfluoroalkyl groups and lipophilic groups, oligomers containing perfluoroalkyl groups, hydrophilic groups, and lipophilic groups, and urethanes containing perfluoroalkyl groups and lipophilic groups.

The above-mentioned surfactants may be used alone, or in combination of two or more thereof, and a readded to the developer in an amount the range of 0.001 to 10 mass %, and more preferably 0.01 to 5 mass %.

[Development Stabilizer]

Various development stabilizers are used in the developer and the replenisher usable in the invention. Preferred examples thereof may include polyethylene glycol adducts of sugar alcohol disclosed in JP-A-6-282079, tetraalkylammonium salts such as tetrabutylanmonium hydroxide, phosphonium salts such as tetrabutylphosphonium bromide, and iodonium salts such as diphenyliodonium chloride.

They further include anionic surfactants or amphoteric surfactants described in JP-A-50-51324, water-soluble cationic polymers described in JP-A-55-95946, and water-soluble amphoteric polyelectrolytes described in JP-A-56-142528.

Furthermore, they include alkylene glycol-added organic boron compounds described in JP-A-59-84241, polyoxyethylene-polyoxypropylene block polymerization type water-soluble surfactants described in JP-A-60-111246, polyoxyethylene-polyoxypropylene-substituted alkylenediamine compounds described in JP-A-60-129750, polyethylene glycol having a weight-average molecular weight of 300 or more described in JP-A-61-215554, fluorine-containing surfactants having cationic groups in JP-A-63-175858, water-soluble ethylene oxide addition compounds obtained by adding 4 moles or more of ethylene oxide to acids or alcohols in JP-A-2-39157, and water-soluble polyalkylene compounds.

[organic Solvents]

To the developers and the developer replenisher, organic solvents are further added, if required. Such organic solvents suitably have a solubility in water of about 10 mass % or less, and are preferably selected from the ones having a solubility in water of 5 mass % or less. Examples thereof may include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzylalcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The content of the organic solvent is 0.1 to 5 mass % based on the total mass of the solution used. The amount of the solution used is closely related to the amount of the surfactants used. The amount of the surfactants is preferably increased with an increase in amount of the organic solvents. This is due to the following fact. When the surfactants are used in small amounts and the organic solvents are used in large amounts, the organic solvents are not completely dissolved. As a result, it becomes impossible to expect favorable developability to be ensured.

[Reducing Agent]

To the developer and the replenisher for use in the invention, a reducing agent can be further added. This prevents the printing plates from being stained. In particular, this is effective in developing negative working photosensitive lithographic printing plates containing photosensitive diazonium salt compounds. Preferred examples of the organic reducing agents may include phenol compounds, such as thiosalicylic acid, hydroquinone, Metol, methoxyquinone, resorcin, and 2-methylresorcin, and amine compounds such as phenylenediamine and phenylhydrazine. Further preferred examples of the inorganic reducing agent may include sodium salts, potassium salts, and ammonium salts of inorganic acids such as sulfurous acid, hydrogen sulfurous acid, phosphorous acid, hydrogen phosphorous acid, dihydrogen phosphorous acid, thiosulfuric acid, and dithionous acid. Out of these reducing agents, particularly excellent in stain prevention effect are sulfites. These reducing agents are preferably contained in an amount in the range of 0.05 to 5 mass % based on the amount of the developer in use.

[Organic Carboxylic Acid]

To the developer and the replenisher for use in the invention, organic carboxylic acids can also be further added. The organic carboxylic acids are preferably aliphatic carboxylic acids and aromatic carboxylic acids having 6 to 20 carbon atoms. Specific examples of the aliphatic carboxylic acids include caproic acid, enanthylic acid, caprylic acid, lauric acid, myristic acid, palmitic acid, and stearic acid. Particularly preferred are alkanoic acids each having 8 to 12 carbon atoms. Further, they may be either unsaturated fatty acids having double bonds in carbon chains or the ones of branched carbon chains.

The aromatic carboxylic acid is a compound comprising a carboxyl group substituted on a benzene ring, a naphthalene ring, an anthracene ring, or the like. Specific examples thereof may include: o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphtoic acid, 3-hydroxy-2-naphthoic acid, 2-hydroxy-1-naphthoic acid, 1-naphtoic acid, and 2-naphthoic acid. Hydroxynaphthoic acid is particularly effective.

The foregoing aliphatic and aromatic carboxylic acids are preferably used in the form of sodium salt, potassium salt, or ammonium salt to enhance its water solubility. The content of the organic carboxylic acid in the developer for use in the invention has no particular restriction. However, when it is less than 0.1 mass %, the resulting effect is not sufficient. On the contrary, when it is 10 mass % or more, not only a further improvement of the effect cannot be achieved, but also when another additive is used in combination, the dissolution may be inhibited. Accordingly, the amount of the organic carboxylic acid to be added is preferably 0.1 to 10 mass %, and more preferably 0.5 to 4 mass % based on the amount of the developer in use.

[Antiseptics]

Antiseptics can be added to the developer, washing water, or a finishing liquid. Known antiseptics for use in fabric, wood processing, food, cosmetic, and agricultural chemical fields and other fields can be used. There can be used known antiseptics such as quaternary ammonium salts, monohydric phenol derivatives, dihydric phenol derivatives, polyhydric phenol derivatives, imidazole derivatives, pyrazolopyrimidine derivatives, monohydric naphthol, carbonates, sulfone derivatives, organotin compound, cyclopentane derivatives, phenyl derivatives, phenol ether derivatives, phenol ester derivatives, hydroxylamine derivatives, nitrile derivatives, naphthalines, pyrrole derivatives, quinoline derivatives, benzothiazole derivatives, secondary amines, 1,3,5-triazine derivatives, thiadiazole derivatives, anilide derivatives, pyrrole derivatives, halogen derivatives, dihydric alcohol derivatives, dithiols, cyanic acid derivatives, thiocarbamide derivatives, diamine derivatives, isothiazole derivatives, monohydric alcohols, saturated aldehydes, unsaturated monocarboxylic acids, saturated ethers, unsaturated ethers, lactones, amino acid derivatives, hydantoins, cyanuric acid derivatives, guanidine derivatives, pyridine derivatives, saturated monocarboxylic acids, benzenecarboxylic acid derivatives, hydroxycarboxylic acid derivatives, biphenyl, hydroxamic acid derivatives, aromatic alcohols, halogenophenol derivatives, benzenecarboxylic acid derivatives, mercaptocarboxylic acid derivatives, quaternary ammonium salt derivatives, triphenylmethane derivatives, hinokitiol, furan derivative, benzofuran derivatives, acridine derivatives, isoquinoline derivatives, arsine derivatives, thiocarbamic acid derivatives, phosphoric acid esters, halogenobenzene derivatives, quinone derivatives, benzenesulfonic acid derivatives, monoamine derivatives, organic phosphoric acid esters, piperazine derivatives, phenazine derivatives, pyrimidine derivatives, thiophanate derivatives, imidazoline derivatives, isoxazole derivatives, and ammonium salt derivatives. As particularly preferred antiseptics, mention may be made of the salts of pyridinethiol-1-oxide, salicylic acid, and salts thereof, 1,3,5-trishydroxyethylhexahydro-S-triazine, 1,3,5-trishydroxymethylhexahydro-S-triazine, 1,2-benzisothiazolin-3-one, 5-chloro-2-methyl-4-isothiazolin-3-one, and 2-bromo-2-nitro-1,3-propanediol. These antiseptics are added preferably in an amount such that they exert effects with stability against bacteria, mold, yeast, and the like. The preferred amount varies depending on the kinds of bacteria, mole, yeast, and the like. However, the antiseptics are used preferably in an amount in the range of 0.01 to 4 mass % based on the amount of the solution used. Further, two or more antiseptics are preferably used so as to bring about effects against various bacteria and mold.

[Others]

The developer and the replenisher for use in the invention can also further contain anti-forming agent, hard-water softener, and the like, if required. Examples of hard water-softener may include: polyphosphoric acid and sodium salts, potassium slats, and ammonium salts thereof, aminopolycarboxylic acids such as ethylenediamineteteraacetic acid, diethylenetriaminepentaacetic acid, triethylenetetraminehexaacetic acid, hydroxyethylethylenediaminetriacetic acid, nitrylotriacetic acid, 1,2-diaminocyclohexanetetraacetic acid, and 1,3-diamino-2-propanol tetraacetic acid, and sodium salts, potassiumsalts, and ammonium salts thereof, aminotri (methylene phosphonic acid), ethylenediamine tetra (methylene phosphonic acid), diethylenetriaminepenta (methylene phosphonic acid), triethylenetetraminehexa(methylene phosphonic acid), hydroxyethylethylene diaminetri (methylene phosphonic acid) and 1-hydroxyethane-1, and 1-diphosphonic acid, and sodium salts, potassium salts, and ammonium salts thereof.

The optimum value for the amount of such a hard-water softener to be added varies depending upon its chelating capability, the hardness of the hard water to be used, and the amount of hard water. However, if the general amount is shown, it is in the range of 0.01 to 5 mass %, and more preferably 0.01 to 0.5 mass % based on the amount of the developer in use. When it falls short of the range, the intended purpose cannot be sufficiently achieved. Whereas, when the amount exceeds the range, an adverse effect on the image portions, such as color dropout arises.

The residual component of the developer and the replenisher is water, to which still various additives known in the art can be added, if required. From the viewpoint of the transportation, the developer and the replenisher for use in the invention advantageously take a concentrated form having a lower content of water than when used, and they are diluted with water for use. The degree of concentration in this case is properly such that separation and deposition of the respective components are not caused. The developer temperature is preferably 15 to 40° C., and more preferably 20 to 35° C. The developing time is preferably 5 to 60 sec, and more preferably 7 to 40 seconds.

The method of the invention can also be applied to the developers described in EP0836120A1, EP0908785A, EP0908306A, EP0914941A1, JP-A-11-327163, JP-A-11-327160, Japanese Patent Application No. 2000-255670, and the like, other than the foregoing developers.

Next, photosensitive lithographic printing plates usable in the invention will be described below. As image recording materials capable of recording through infrared laser exposure, there are proposed positive working image recording materials each containing a binder such as cresol resin, a substance which absorbs light and generates heat, and another substance which is thermally decomposable, and substantially reduces the solubility of the binder in an undecomposed state, such as quinonediazide, in JP-A-7-285275, JP-A-11-119419, Japanese Patent Application No. 11-182751, and the like. For the positive working image recording materials, at exposed portions, the substance, which absorbs light and generates heat, generates heat, thereby causing the solubility of the exposed portions to be exhibited.

Furthermore, JP-A-7-20625, JP-A-11-218903, Japanese patent Application Nos. 11-308286 and 11-332936, and the like describe negative working image recording materials each comprising a compound which is decomposed by light or heat, and generates an acid, a cross-linking agent which effects crosslinking by an acid, at least one alkali-soluble resin, and an infrared absorber. For the negative working image recording materials, at exposed portions, the substance, which absorbs light and generates heat, generates heat, and the compound, which is decomposed and generates an acid, generates an acid by the heat. This promotes the crosslinking reaction of the crosslinking agent which effects crosslinking by the acid with the alkali-soluble resin, thereby performing image recording.

The image recording materials as described above can be used as lithographic printing plates. For the formation of lithographic printing plates, image recording is performed on the lithographic printing plates through infrared laser exposure. Then, the plates are, if required, subjected to a heat treatment, followed by a development treatment.

Further, the invention is also applicable to the treatment of the photosensitive lithographic printing plates using photopolymerizable compositions disclosed in, for example, Japanese Patent Application No. 10-251521, JP-A-2000-39724, and Japanese Patent Application 2000-276811. The photosensitive lithographic printing plate using a photopolymerizable composition has a support prepared by subjecting an aluminum plate to a hydrophilization treatment, and, on the support, a photopolymerizable photosensitive layer containing a compound having an addition-polymerizable ethylenic double bond and a polymer having a crosslinkable group on its side chain. The invention is also applicable to the treatment of subjecting the lithographic printing plate to image exposure with a laser light, and then developing it.

Further, the invention is also applicable to the treatment of the conventionally widely used positive working photosensitive lithographic printing plates disclosed in, for example, JP-A-9-274324, JP-A-2000-231188, and Japanese Patent Application No. 2000-13656. This positive working photosensitive lithographic printing plate includes an aluminum plate as a support, and, on the aluminum plate, a photosensitive layer comprising an o-quinonediazide compound. O-quinonediazide compounds are known to be converted to carboxylic acids through ultraviolet exposure. Therefore, when this is developed with an alkali aqueous solution, only the exposed portions of the photosensitive layer are removed, so that the support surface is exposed. Since the surface of the aluminum support is hydrophilic, the portions (non-image portions) at which the support has been exposed by the development retain water and repel oil-based ink. On the other hand, since the areas (image portions) where the photosensitive layer has not been removed are lipophilic, the areas repel water and accept ink. For the photosensitive layer of the positive working lithographic printing plates, a cresol-novella resin is generally used as the binder for the o-quinonediazide compound. Still further, the method of the invention is also applicable to the treatment of the negative working photosensitive lithographic printing plate, which is disclosed in JP-A-7-295212 and Japanese Patent Application No. 2000-103135.

Below, the invention will be described by way of embodiments shown in the accompanying drawings. FIG. 1 is a view showing a configuration of a first embodiment of an automatic developing apparatus for carrying out a developer replenishing method in accordance with the invention.

As shown in FIG. 1, the automatic developing apparatus 2 includes a developing unit 6 for subjecting photosensitive lithographic printing plates (hereinafter, referred to as "PS plates") 4 to a development treatment, a two-stage structured finisher unit 8 for washing off the developer attached to the PS plate 4 after development and coating a gum solution thereon, and a drying unit 10 for drying the PS plate after gum solution coating.

Whereas, when the PS plate 4 which requires heating prior to a development treatment is treated, a pre-heating unit not shown in FIG. 1 can also be provided. The pre-heating unit is arranged upstream in the direction of transport of the developing unit 6, and has a function of keeping a prescribed PS plate surface temperature only during a prescribed period while transporting the PS plate 4. The PS plate 4 inserted into the pre-heating unit is automatically transported with heating to the next step. Further, a pre-water washing unit not shown in FIG. 1 can also be provided. The pre-water washing unit is arranged upstream in the direction of transport of the developing unit 6 and downstream in the direction of transport of the pre-heating unit, and has a function of washing and cooling the PS plate surface with washing water, while transporting the PS plate 4. The PS plate 4 inserted into the pre-water washing unit is automatically transported to the developing unit 6 of the next step.

An insertion aperture 14 is formed in a side plate 12 of the automatic developing apparatus 2, and the PS plate 4 inserted through the insertion aperture 14 is transported to the developing unit 6 by transport rollers 16. At the insertion aperture 14, a rubber blade 18 is disposed, so that the insertion aperture 14 is closed by the rubber blade 18 except when the PS plate 4 is being inserted.

In a developer tank 20 of the developing unit 6, transport rollers 22, brush rollers 24, and squeeze rollers 26 are included in this order from the upstream side in the transport direction, and backup rollers 28 are included at proper sties therebetween. The PS plate 4 is immersed in the developer while being transported by the transport rollers 22, thereby to be subjected to a development treatment.

The finisher unit 8 contiguous to the developing unit 6 includes a first finisher unit 8a and a second finisher unit 8b. At the respective finisher units 8a and 8b, transport rollers 30a and 30b for transporting the PS plate 4, spray members 34a and 34b for spraying the gum solution in finisher tanks 32a and 32b onto the PS plate 4 are disposed. Thus, the PS plate 4 after development treatment is sprayed and coated with the gum solution by the spray members 34a and 34b while being transported by the transport rollers 30a and 30b. Incidentally, the gum solution in the finisher tank 32b of the second finisher unit 8b located downstream is supplied in an overflowing manner into the finisher tank 32a of the first finisher unit 8a located upstream. In stead of such a structure, the gum solution may also be supplied in the same manner using a pump or the like.

Alternatively, the following configuration is also usable. The first finisher unit 8a is a water washing zone with washing water. To the finisher tank 32a of the first finisher unit 8a, washing water is supplied by a supply pump not shown without supplying a solution from the second finisher unit 8b.

The drying unit 10 contiguous to the finisher unit 8 is equipped with a guide roller 36 and a pair of skewer rollers 38 in this order from the upstream side in the transport direction. Further, the drying unit 10 is equipped with a drying means such as a warm-air supply means or a heat generation means, not shown. In the drying unit 10, a discharge aperture 40 is provided, so that the PS plate 4 dried by the drying means 10 is discharged through the discharge aperture 40. Further, a shutter 44 is provided in a passage 46 between the drying unit 10 and the finisher unit 8, so that the passage 46 is closed by the shutter 44 except when the PS plate 4 is passing through the passage 46.

Further, to the second finisher tank 32b, the gum solution in a gum solution tank 56 is fed by a pump 77, and a diluent 57 in a replenisher diluent storage tank 53 is also fed by a replenisher diluent supply pump 78. Herein, the replenishment ratio between the gum solution and the diluent is, for example, 1:1. In accordance with the replenishment, the gum waste solution over flowed from the first finisher tank 32a is recovered into a waste solution tank 54 in the same manner as with the developer waste solution.

In the developer tank 20, a box-shaped shielding cover 60 is provided integrally with the tank walls. The bottom wall of the shielding cover 60 is continuously curved in arcs so as not to be in contact with the upper circumferential surfaces of the transport rollers 22, the brush rollers 24, and the backup rollers 28. As a result, it is prevented from interfering with the rollers, and the like.

An airtight space is formed above the developer tank 20 because of the box-like shape of the shielding cover 60, whereby the amount of air in the developing unit 6 is minimized. Further, the presence of the shielding cover 60 minimizes the contact area between the developer and air.

In the automatic developing apparatus 2 of the foregoing structure, rubber blades 62 are provided at proper sites, so that the space from the developing unit 6 to the second finisher unit 8b is formed substantially airtightly against an external atmosphere. This prevents outside air from entering therein. Further, the space between the developing unit 6 and the first finisher unit 8a is also formed substantially airtightly by the rubber blade 62. This prevents the air in the first finisher unit 8a from flowing into the developing unit 6. Therefore, the developing unit 6 has a sealed structure, which is substantially airtight, and receives little air, although air slightly flows therein when the PS plate 4 is passing therethrough.

Then, the developing unit 6 will be described in details. To the developer tank 20, a circulation pipe 80 for the developer is connected. In the circulation pipe 80, a developer circulation pump 71, an electric conductivity sensor 73, and a filter (not shown) are individually disposed.

The developer circulation pump 71 sucks the developer in the developer tank 20 through a suction port in the bottom of the developer tank 20 into the circulation pipe 80, and allows the developer to pass through the circulation pipe 80 and to be discharged into the developer tank 20, again. The filter filtrates the developer flowing through the circulation pipe 80. The electric conductivity sensor 73 measures the electric conductivity of the developer flowing through the circulation pipe 80.

Further, the developing unit 6 is equipped with replenishing pipes 90 and 91, an undiluted replenisher storage tank 55 connected to the replenishing pipe 90, an undiluted replenisher supply pump 74 interposed in the replenishing pipe 90, the replenisher diluent storage tank 53 connected to the replenishing pipe 91, and a replenisher diluent supply pipe 76 interposed in the replenishing pipe 91, which respectively constitute a plenishing device, are provided. These function as replenisher supply means. The development waste solution which has overflowed from the developer tank 20 is recovered into the waste solution tank 54.

Specifically, a pair of replenishing pipes 90 and 91 for a developer replenisher obtained by diluting an undiluted developer replenisher 58 with the replenisher diluent 57 are provided in the vicinity of the developer tank 20. The replenishing pipe 90 for the undiluted developer replenisher 58 is connected to the undiluted replenisher storage tank 55 at the other end (at the bottom middle in FIG. 1). The undiluted replenisher supply pump 74 is provided in the pipe. The undiluted replenisher supply pump 74 supplies the undiluted developer replenisher 58 from the undiluted replenisher storage tank 55 to the developer tank 20.

The replenishing pipe 91 for the replenisher diluent 57 is connected at the other end (at the bottom middle in FIG. 1) to the replenisher diluent storage tank 53. The replenisher diluent supply pump 76 is provided in the pipe. The replenisher diluent supply pump 76 supplies the replenisher diluent (water) 57 from the replenisher diluent storage tank 53 to the developer tank 20. Namely, the replenishing pipe 91, the replenisher diluent supply pump 76, and the replenisher diluent storage tank 53 constitute a diluent supply device.

The undiluted replenisher supply pump 74 and the replenisher diluent supply pump 76 are controlled by a controller (control means) 50 including a control ROM 51a or a control RAM 51b which is a condition storage means, and a time measuring unit 52 based on signals from the electric conductivity sensor 73 and the time measuring unit 52.

Namely, the controller 50 drives the transport rollers 22, the brush rollers 24, and the squeeze rollers 26, and the like based on signals from a plate detection sensor 27 at a proper timing, thereby to treat and transport the PS plates.

Further, the controller 50 supplies the developer replenisher (undiluted developer replenisher 58+replenisher diluent 57) in a predetermined replenishing amount/replenisher 'dilution ratio from the undiluted replenisher storage tank 55 and the replenisher diluent storage tank 53 to the developer tank 20 when the measured electric conductivity value by the electric conductivity sensor 73 falls short of the proper electric conductivity value calculated based on the replacement ratio of the developer replenisher, and the like.

Then, the controller 50 measures the elapsed time between the previous replenishment and the present replenishment by means of the time measuring unit 52, calculates a new target electric conductivity value using the value, and corrects and updates the value to the calculated new target electric conductivity value.

Then, the control by the controller 50 will be described by reference to FIGS. 2 and 3.

Figure 2:
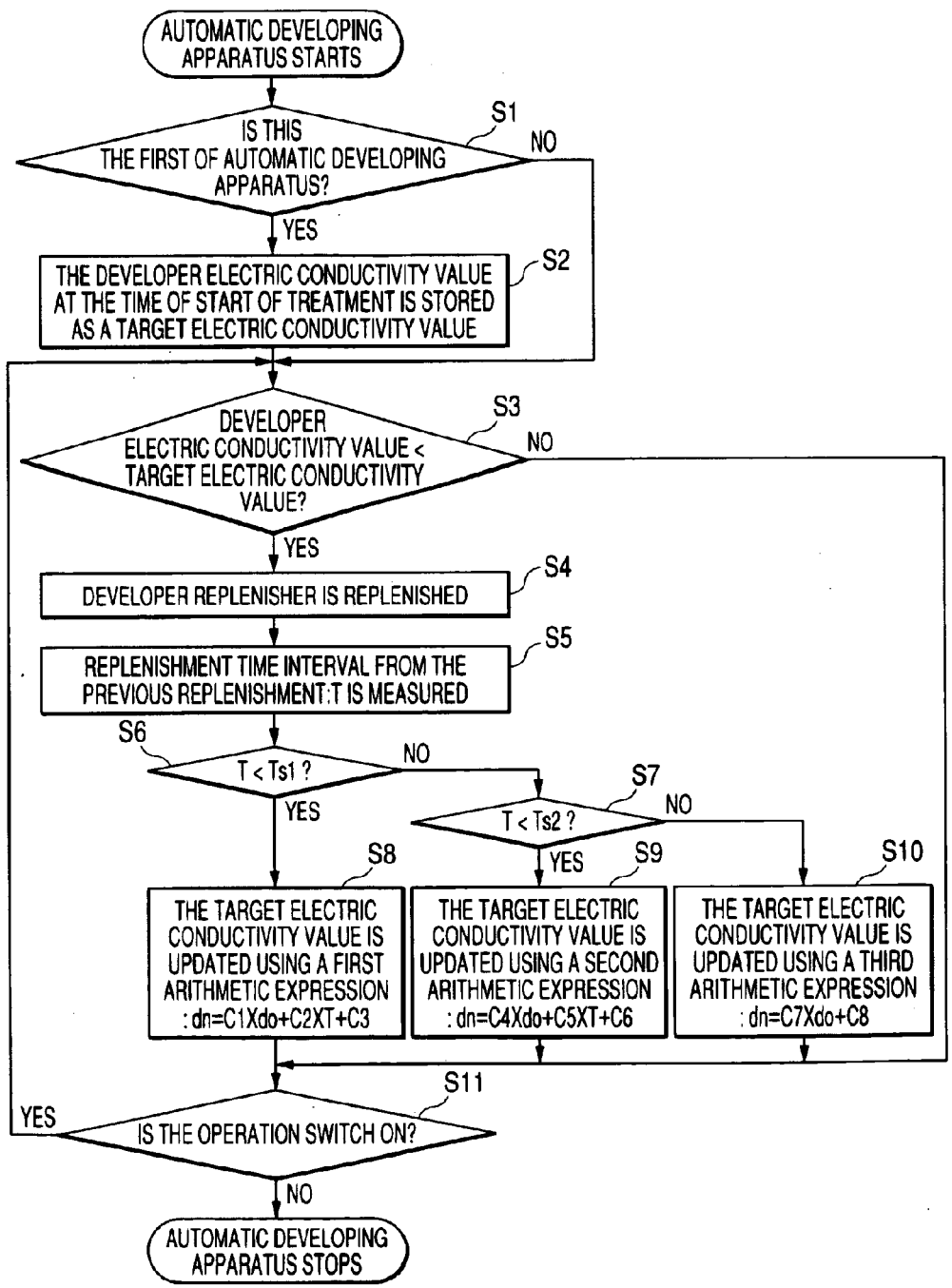
FIG. 2 is a flowchart showing the contents controlled by a controller in the developer replenishing method of the invention.

FIG. 2 is a flowchart showing a control method by the controller 50. FIG. 3 is a flowchart illustrating the control after the measured electric conductivity value has exceeded a target electric conductivity value after the start-up of the automatic developing apparatus.

The control method of the invention shown in FIG. 2 is schematically as follows. As the electric conductivity value of a developer having an activity within a proper range, for example, the developer electric conductivity value at the time of first start of the treatment of the automatic developing apparatus is stored as a target electric conductivity value. The electric conductivity value of the developer is then measured in a given cycle. When the measured electric conductivity value is lower than the target electric conductivity value, a predetermined given amount of a developer replenisher is supplied to the developer.

At this step, the replenishment time interval which is the elapsed time from the previous replenishment with the developer replenisher is measured. Then, an arithmetic expression for calculating the target electric conductivity value is selected depending upon which of the replenishment time interval and the preset replenishment time interval threshold value is larger. The target electric conductivity value is successively corrected and updated by the selected arithmetic expression.

A plurality of possible arithmetic expressions for calculating the target electric conductivity value and replenishment time interval threshold values are prepared in advance.

This is for preventing a discrepancy from occurring between the target electric conductivity value to be corrected based on the replenishment time interval and the proper electric conductivity value due to the following reason. The aging exhaustion conditions of the developer variously change by the fluctuations in environmental carbonic acid gas concentration, changes in developer temperature, and the like. Therefore, the changes in aging exhaustion conditions cannot be allowed completely with only one replenishment time interval threshold value.

Below, the control processing of FIG. 2 will be sequentially described.

In Step 1, (hereinafter, abbreviated as S1) immediately after the start-up of the automatic developing apparatus, it is determined whether the start-up of the automatic developing machine is the first start-up or not. If it is the first start-up, the process moves to S2, where the developer electric conductivity value at the time of start of processing is stored as an initial target electric conductivity value in a memory unit.

Incidentally, when the developer activity falls within a proper range, the electric conductivity value of the developer after treatment present in the developer tank may also be taken as the target electric conductivity value regardless of whether or not the replenishment has been done. Whether the electric conductivity value of the developer falls within a proper range or not is generally detected by a photosensitive lithographic printing plate on which a commercially available gray scale image such as Stepwedge (manufactured by Fuji Photo Film Co., Ltd.) has been burned.

Upon the first or subsequent start-up of the automatic developing apparatus, the process starts from S3.

Incidentally, although not shown in this flowchart, the electric conductivity value of the developer is measured in a preset given cycle with the automatic developing apparatus of this embodiment.

Then, in S3, it is determined whether the electric conductivity value measured in every given cycle is larger or smaller than the target electric conductivity value stored in S2. When it is smaller than the target electric conductivity value, the process goes to S4. Whereas, when it is larger than the target electric conductivity value, the process goes to S11.

In S4, a predetermined given amount of developer replenisher is supplied to the developer in order to make the electric conductivity value of the developer closer to the target electric conductivity value.

In the next S5, the elapsed time from the previous replenishment (replenishment time interval) T is measured.

Then, in the next S6, it is determined whether the elapsed time T detected in S5 is larger or smaller than the preset first replenishment time interval threshold value Ts1. When the elapsed time T from the previous replenishment is smaller than the first replenishment time interval threshold value Ts1, the process goes to S8. Whereas, when the elapsed time T from the previous replenishment is larger than the first replenishment time interval threshold value Ts1, the process goes to S7.

In S8, using the replenishment time interval T measured in S5, another target electric conductivity value is calculated by the first arithmetic expression expressed by the following equation (1). Then, the target electric conductivity value previously recorded through S2 is corrected and updated $$dn = C1 \times do + C2 \times T + C3 \tag{1}$$

do: Target electric conductivity value before replenishment
dn: Another target electric conductivity value
T: Replenishment time interval measured previously in S5
C1, C2, and C3: Previously experimentally set constant In S7, similarly to S6, it is determined whether the elapsed time T detected in S5 is larger or smaller than the preset second replenishment time interval threshold value Ts2. When the elapsed time T from the previous replenishment is smaller than the second replenishment time interval threshold value Ts2, the process goes to S9. Whereas, when the elapsed time T from the previous replenishment is larger than the second replenishment time interval threshold value Ts2, the process goes to S10.

In S9, using the replenishment time interval T measured in S5, another target electric conductivity value is calculated by the second arithmetic expression expressed by the following equation (2). Then, the target electric conductivity value previously recorded through S2 is corrected and updated $$dn = C4 \times do + C5 \times T + C6 \tag{2}$$

do: Target electric conductivity value before replenishment
dn: Another target electric conductivity value
T: Replenishment time interval measured previously in S5
C4, C5, and C6: Previously experimentally set constant Whereas, in S10, without using the replenishment time interval T measured in S5, another target electric conductivity value is calculated by the third arithmetic expression expressed by the following equation (3). Then, the target electric conductivity value previously recorded through S2 is corrected and updated.

$$dn = C7 \times do + C8 \tag{3}$$

do: Target electric conductivity value before replenishment
dn: Another target electric conductivity value
C7 and C8: Previously experimentally set constant In the above equations (1) to (3), the preferable range of C1 is 0.000 to 1.000, more preferably 0.998, the preferable range of C2 is –3.0000 to +3.0000, more preferably 0.0274, the preferable range of C3 is 0.000 to 3.000, more preferably 0.112, the preferable range of C4 is 0.000 to 1.000, more preferably 0.998, the preferable range of C5 is –0.5000 to +0.5000, more preferably 0.0137, the preferable range of C6 is 0.000 to 3.000, more preferably 0.112, the preferable range of C7 is 0.000 to 1.000, more preferably 0.998, the preferable range of C8 is –30.000 to +30.000, more preferably 0.853, and the preferable range of "do" (initial value of "do") is 30 to 60 mS/cm, more preferably 43 mS/cm.

Upon completion of the correction/update to the newly calculated target electric conductivity value through the foregoing S8, S9, and S10, the process returns to S11. When the operation switch is ON, the process returns to S3. Whereas, when the operation switch is OFF, the process is terminated by the shutdown of the apparatus.

In accordance with the control of the automatic developing apparatus, a plurality of replenishment time interval threshold values, and a plurality of arithmetic expressions for correcting the target electric conductivity value corresponding to the relative magnitudes with respect to the respective replenishment time interval threshold values are prepared in advance. The target electric conductivity value is corrected/updated according to the magnitude of the replenishment time interval. As a result, it is also possible to constantly set a proper target electric conductivity value with respect to the changes in aging exhaustion conditions, namely, the changes in ambient carbonic acid gas concentration, or the changes in reactivity of a carbonic acid gas to the developer as observable under operation/under shutdown of the automatic developing apparatus. Accordingly, it is possible to carry out a development treatment with a stable given sensitivity. Therefore, it is possible to minimize the fluctuations in developer sensitivity with respect to the changes in development treatment conditions, while implementing the development unit of the automatic developing apparatus in a simple and low cost structure Then, a second embodiment of the invention will be described. FIG. 3 is a view for showing a configuration of an automatic developing apparatus in accordance with the second embodiment of the invention.

Figure 3:
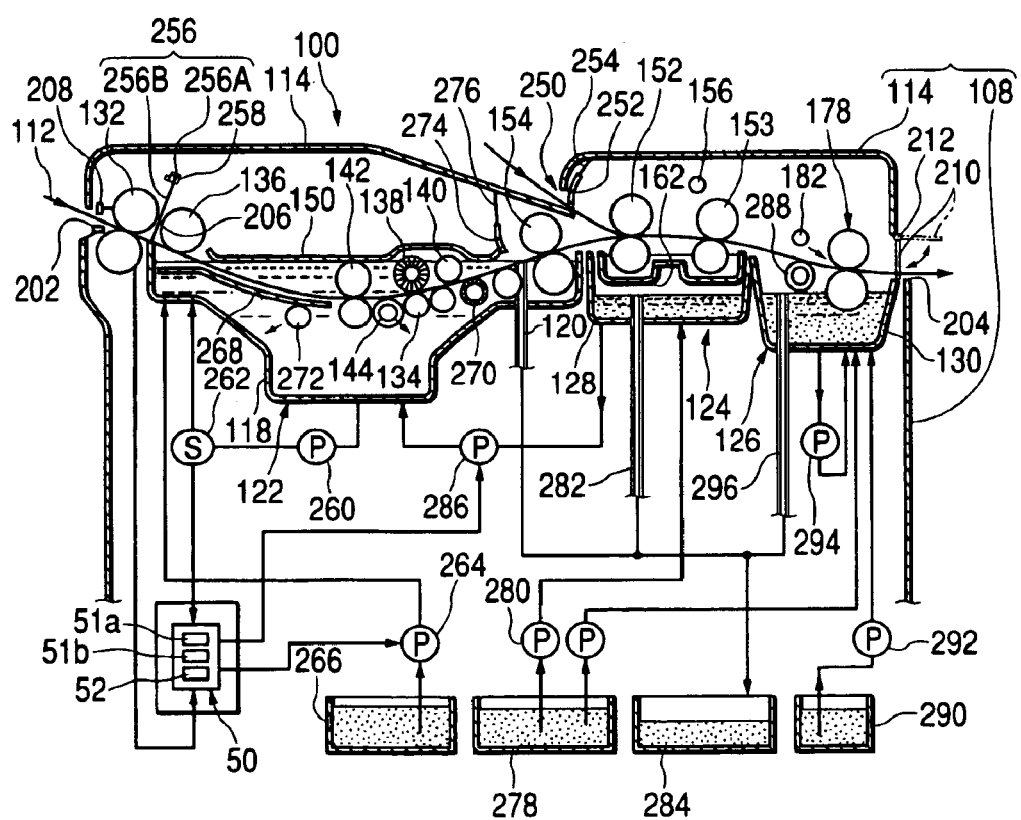
FIG. 3 is a view showing a configuration of a second embodiment of an automatic developing apparatus for carrying out a developer replenishing method of the invention.

As shown in FIG. 3, in an automatic developing apparatus 100 of this embodiment, the internal treatment unit is covered with an outer plate panel 114. Inside the outer plate panel 114, a developing unit 122 including a developer tank for subjecting a PS plate 112 to a development treatment, and an overflow tube 120 for recovering the developer overflowed from the developer tank 118, a water washing unit 124 for washing the developer deposited onto the PS plate 112, and a finisher unit 126 for coating a gum solution onto the PS plate 112 after water washing for a desensitizing treatment are disposed. Incidentally, in the water washing unit 124, a washing water tank 128 is disposed. Whereas, in the finisher unit 126, a gum solution tank 130 is disposed.

In the outer plate panel 114, a slit-like insertion aperture 202 and a discharge aperture 204 are respectively provided. In the top surface of the outer plate panel 114, a reentry insertion aperture (sub-insertion aperture) 250 for inserting the PS plate 112 between the developing unit 122 and the water washing unit 124 is provided. The sub-insertion aperture 250 is an insertion aperture for the PS plate 112, for carrying out treatments except for the development treatment.

In the sub-insertion aperture 250, a blade 252 is disposed. The tip portion of the blade 252 is in contact with the outer plate panel 114 serving as the guide support surface of the sub-insertion aperture 250, and the base portion thereof is fixed on the back side of the outer plate panel 114 via a bracket 254. Accordingly, the sub-insertion aperture 250 is in a closed state by the blade 252.

A drying unit (not shown) dries the PS plate 112 by blowing a warm air onto the both surfaces of the PS plate 112, while transporting the PS plate 112 sent from finisher unit 126 by a large number of rollers not shown.

A pair of transport rollers 132 are disposed on the insertion side of the PS plate 112 to the developer tank 118 of the developing unit 122. It is configured such that the PS plate 112 is inserted from the insertion aperture 202 between the pair of transport rollers 132.

A blade 206 made of rubber is attached in the downstream vicinity of the transport rollers 132. The tip portion of the blade 206 is in contact with the sidewall of the developer tank 118 of the developing unit 122, and the base portion thereof is attached to the outer plate panel 114 through a bracket 256. The bracket 256 includes a fixed part 256A and a sliding part 256B attached to the fixed part 256A with a thumbscrew 258, and the blade 206 is fixed to the sliding part 256B. This allows the configuration such that the tip portion of the blade 206 can be separated from the sidewall of the developer tank 118 by loosening the thumbscrew 258, and sliding the sliding part 256B relative to the fixed part 256A.

Further, a plate detection sensor 208 capable of determining the presence or absence of the PS plate 112, the plate area of the transported plate, and the like is attached in the vicinity of the insertion aperture 202.

The developer tank 118 is in the shape of a generally inverted mountain, in which the top thereof is open and the center portion of the bottom thereof protrudes downward. In the developer tank 118, a pump 260 is disposed, so that the developer in the developer tank 118 is sucked by the pump 260, and blown out from spray pipes 144 and 272 described later. This allows the developer stored in the developer tank 118 to be circulated. During the circulation, the flowing developer passes through an electric conductivity sensor 262 for measuring the electric conductivity of the developer. Further, the undiluted replenisher is supplied from an undiluted developer replenisher storage tank 266 to the developer tank 118 via an undiluted replenisher supply pump 264.

As will be further described in details later, it is configured such that a diluting water is supplied from the washing water tank 128 to the developer tank 118 via a pump 286.

The pumps 264 and 286 are controlled by the controller 50 comprising the control ROM 51a or a control RAM 51b which is a condition storage means, and a time measuring unit 52 based on signals from the electric conductivity sensor 262 and the time measuring device 52. Incidentally, as to the rest, the functions and effects of the controller 50 are the same as with the first embodiment, and hence the description thereon is omitted.

In the developer tank 118, there are disposed a guide plate 268 on the upstream side, and a large number of guide rollers 134 and a rotary brush roller 270 on the downstream side. These guide rollers 134 and rotary brush roller 270 are rotatably put over a pair of sidewalls of the developer tank 118.

A guide roller 136 of a relatively large diameter is disposed above the guide plate 268, and rotary brush rollers 138 and 270, and guide roller 140 are respectively disposed above the guide roller 134. Whereas, in the center portion of the developer tank 118, a pair of squeezing rollers 142 having a function of squeezing the surface of the PS plate are disposed.

The overflow pipe 120 is disposed at the most downstream side of developer tank 118, so that the developer is guided to a waste solution tank 284, and disposed of thereby when the liquid surface of the developer exceeds a predetermined level.

A liquid surface cover 150 is disposed on the surface of the developer in the developer tank 118. The liquid surface cover 150 has a portion projecting generally in an arc, which corresponds to the rotary brush roller 138 and the guide roller 140 adjacent thereto, and is in close contact with the developer surface for minimizing the contact between the developer surface and air. It is attached at its both ends along the transport direction of the PS plate 112 to the sidewalls not shown in a slidable configuration so as to be vertically movable with changes in amount of the developer.

The downstream end of the liquid surface cover 150 along the transport direction is in contact with the tip of a blade 274. The blade 274 is fixed to the outer plate panel 114 via a bracket 276. With the blade 274, the liquid surface of the developer exposed at the downstream end of the liquid surface cover 150 in the transport direction is separated from above the liquid surface cover 150. Thus, together with the blade 206 (being in contact with the sidewall of the developer tank 118) in the vicinity of the insertion aperture 202, the upper space of the liquid surface cover 150 is perfectly separated from outside air. This can inhibit the evaporation of the developer.

On the most downstream side along the transport direction of the developer tank 118, there are disposed a pair of rollers 154 which hold and transport the PS plate 112, and squeeze the developer from the surface of the PS plate 112.

On the other hand, in the automatic developing apparatus 100, the washing water tank 128 of the water washing unit 124 is disposed downstream of the developing unit 122. Above the washing water tank 128, two pairs of transport rollers 152 and 153 are disposed.

The washing water tank 128 stores washing water used to wash and remove the developer from the PS plate 112 fed from the developer tank 118. A spray pipe 156 is disposed upstream of the transport roller 153 and above the transport passage. In the outer surface of the spray pipe 156, a plurality of discharge holes communicating with the inside thereof are formed. The washing water drawn up by the pump 280 from the washing water tank 278 is dropped from the spray pipe 156 on the upper roller of the transport rollers 153. This rotates the transport roller 153, which allows the washing water to rapidly spread on the surface of PS plate 112. As a result, the surface of the PS plate is cleaned with washing water.

Each lower portion of the lower rollers of the transport rollers 152 and 153 is put in a pan 162. Washing water is stored in the pan 162, and drawn up by the lower rollers, to clean the back of the PS plate 112, and to prevent the upper transport rollers 152 and 153 from drying.

Further, the configuration is as follows. The washing water spread over the surface of PS plate 112 along the width direction thereof falls into the pan 162 underneath from the opposite edges along the width direction of the PS plate 112, and the back side of the PS plate 112 is washed with the washing water drawn up from the pan 162. The washing water overflowed from the pan 162 is guided into the washing water tank 128. In the washing water tank 128, an overflow tube 282 is disposed, so that the washing water is disposed of into the waste solution tank 284 when the top surface of the washing water exceeds the predetermined solution level.

Whereas, the washing water tank 128 and the developer tank 118 communicate with each other via a pump 286, so that the washing water in the washing water tank 128 is guided into the developer tank 118 by driving of the pump 286, and becomes available as the diluent for supplying an undiluted replenisher to the developer tank 118.

Above the gum solution tank 130 of the finisher unit 126, there is provided a pair of transport rollers 178. It is configured such that the PS plate 112 fed by the transport roller 153 is guided to the transport rollers 178.

Further, upstream of the transport rollers 178, spray pipes 182 and 288 are disposed vertically of the transport passage. The gum solution drawn up by a pump 292 from a gum solution tank 290 is discharged from the spray pipes 182 and 288, and supplied to the front surface and back surface of the PS plate 112.

It is configured such that the transport rollers 178 hold and transport the PS plate 112, and squeeze the gum solution supplied by the spray pipe 182 for desensitizing the surface of the PS plate 112. The gum solution squeezed from the surface of the PS plate 112 is recovered into the gum solution tank 130. The gum solution in the gum solution tank 130 is allowed to circulate by a pump 294. Further, the gum solution tank 130 is provided with an overflow tube 296. This allows a configuration such that the gum solution is guided to the waste solution tank 284, and disposed of thereby when the top surface of the gum solution exceeds a predetermined solution level.

The lower portion of the lower transport roller 178 is immersed in the gum solution stored in the gum solution tank 130. For the back side of the PS plate 112, the gum solution is drawn up from the gum solution tank 130 by the lower transport roller 178, thereby to carry out a coating treatment thereon. This allows the following configuration. The transport roller 178 raises the gum solution, and carries out a desensitizing treatment on the back side of the PS plate 112. In addition, the drying of the upper transport roller 178 is inhibited, so that the components of the treatment solution are prevented from being deposited on the surface of the transport rollers 178.

The PS plate 112 which has undergone the treatment at the finisher unit 126 passes through the discharge aperture 204 of a casing 200, and is fed to the drying unit (not shown).

Herein, A lid body 210 as a partition plate is provided at the discharge aperture 204. The lid body 210 is fixed to a shaft 212. The shaft 212 is made rotatable by a driving means not shown (for example, a solenoid).

The shaft 212 rotates based on the detection of the PS plate 112 by the plate detection sensor 208 disposed in the vicinity of the insertion aperture 202. Namely, the lid body 210 is held generally horizontally (with the discharge aperture 204 open) during the period in which the plate detection sensor 208 is detecting the PS plate 112, and until a predetermined period elapses from the instant when the sensor 208 has ceased to detect the PS plate 112 (from the instant when the sensor 208 has detected the rear end), and made vertical (with the discharge aperture 204 closed) except for this period.

Below, the effect of this embodiment will be described. First, the treatment tanks such as the developer tank 118, the washing water tank 128, and the gum solution tank 130 are covered with the casing 200 including the outer plate panel 114, a main box 108 and the like. Further, in the state where no PS plate 112 is being subjected to a development treatment by the automatic developing apparatus 100, the insertion aperture 202 is closed because the blade 206 is in contact with the sidewall of the developer tank 118. On the other hand, for the discharge aperture 204, the plate detection sensor 208 does not detect the. PS plate 112, and hence the lid body 210 is kept in a vertical posture. As a result, the discharge aperture 204 is also closed. Furthermore, the sub insertion aperture 250 is also closed by the blade 252, and the space above the liquid surface cover 150 of the developing unit 122 is also closed by the blades 206 and 274. Accordingly, the developer in the developer tank 118, the washing water in the washing water unit 124, and the gum solution in the finisher unit 126 will not be exposed to outside air, and hence undergo almost no $CO_2$ fatigue. As a result, it is possible to inhibit the reduction in developing capability caused by the deterioration with time. Therefore, for example, it is possible to drastically reduce the amount of the undiluted replenisher to be supplied in the developing unit 122. In particular, the developer surface in the developer tank 118 is covered with the liquid surface cover 150, and hence the effect of preventing the contact between the developer and outside air is large.

Incidentally, in order to minimize the contact between the developer and outside air, the length of time during which the lid body 210 is opened is more desirably minimized. Therefore, the lid body 210 is preferably configured to be opened during only the period in which the PS plate 112 is passing, and to be not opened during other period.

Further, the control by the controller 50 is the same as the contents of the flowchart of the supply method of a developer replenisher in FIG. 2 described in the first embodiment, Therefore, a description thereon is herein omitted.

EXAMPLES

Next, for the cases where the supply methods of a developer replenisher in the foregoing embodiments, and conventional supply method of a developer replenisher have been respectively applied, the range of fluctuations in sensitivity of each developer was experimentally determined. Below, the preparation methods of developers A, B, C, A, and E, replenishers A, B, C, D, and E, and photosensitive material A, B, C, D, E, F, G, H, I, J, and K, used in Examples 1 to 10 and Comparative Examples 1 to 10 will be described.

[Developer A]

Developer DP-7 manufactured by Fuji Photo Film Co., Ltd., was diluted in a ratio of 1/9, and used.

[Developer B]

The following compound was added in a proportion of 0.01 g per liter of an aqueous solution containing 5.0% of potassium salt comprising D-sorbit/potassium oxide $K_2O$ prepared by combining a non-reducing sugar with a base, 0.015% of OLFIN AK-02 (manufactured by NISSIN CHEMICAL INDUSTRY, Co., Ltd.), and 0.010% of a surfactant D-1105 (manufactured by TAKEMOTO OIL & FAT Co., Ltd.), thereby preparing a solution in an amount equal to the volume of a developer tank.

$$C_{12}H_{23}N-CH_2CH_2COONa$$
$$|$$
$$CH_2CH_2COOH$$

[Developer C]

Developer DP-4 manufactured by Fuji Photo Film Co., Ltd., was diluted in a ratio of 1/8, and used.

[Developer D]

Developer LP-D manufactured by Fuji Photo Film Co., Ltd., was diluted in a ratio of 1/10, and used.

[Developer E]

Preparation was carried out with the following formulation.

Potassium hydroxide 0.15 g, Polyoxyethylene phenyl ether (n=13) 5.0 g, Chelest 400 (chelating agent) 0.1 g, and Water 94.75 g

[Replenisher A]

Developer Replenisher DP-7RW manufactured by Fuji Photo Film Co., Ltd., was used.

[Replenisher B]

Preparation was carried out with the following formulation. The following compound was added in a proportion of 0.01 g per liter of an aqueous solution containing 6.0% of potassium salt comprising D-sorbit/potassium oxide $K_2O$ prepared by combining a non-reducing sugar with a base and 0.015% of OLFIN AK-02 (manufactured by NISSIN CHEMICAL INDUSTRY, Co., Ltd.), thereby preparing a solution in an amount equal to the volume of a developer tank.

$$C_{12}H_{23}N\begin{array}{c}CH_2CH_2COONa\\ \\CH_2CH_2COOH\end{array}$$

[Replenisher C]

Developer Replenisher DP-4R manufactured by Fuji Photo Film Co., Ltd., was used.

[Replenisher D]

Developer Replenisher LP-DR manufactured by Fuji Photo Film Co., Ltd., was used.

[Replenisher E]

Preparation was carried out with the following formulation.

Potassium hydroxide 6.0 g, Newkol B13 23.0 g, Chelest 400 (chelating agent) 1.0 g, and Purified water 70.0 g Next, for photosensitive plates A to J for use in Examples 3 to 10 and Comparative Examples 1 to 9, preparation methods, development pretreatments, and exposure conditions thereof will be described.

[Photosensitive Plate A]

Preparation was carried out based on Example 1 of JP-A-2000-231188. The photosensitive plate obtained was subjected to image exposure for 1 minute with a printer FT26V2UPNS manufactured by NuArc Co., Inc., in USA (light source: a 2 kW metal halide lamp). Evaluation of the developer sensitivity was carried out using the photosensitive plate onto which the image of Stepwedge (difference in density between respective steps being 0.15) manufactured by Fuji Photo Film Co., Ltd., has been exposed under the foregoing conditions.

[Photosensitive Plate B]

Preparation was carried out based on Example 1 of JP-A-7-295212. The photosensitive plate obtained was subjected to 50-count image exposure with a printer FT26V2UPNS manufactured by NuArc Co., Inc., in USA (light source: a 2 kW metal halide lamp). Evaluation of the developer sensitivity was carried out using the photosensitive plate onto which the image of Stepwedge (difference in density between respective steps being 0.15) manufactured by Fuji Photo Film Co., Ltd., has been exposed under the foregoing conditions.

[Photosensitive Plate C]

Synthetic Example 1

25.6 g of a compound (a) as a structural unit (1), 26.4 g of a compound (b) as a structural unit (2), and 20.4 g of lauryl methacrylate, and 160 g of dimethylacetamide as a structural unit (3) were charged in a 500-ml 3-neck flask, and the flask was kept at 65° C. with stirring under a nitrogen flow. 2,2'-Azobis (2,4-dimethylvaleronitrile) was added in an amount of 2.30 g thereto, and stirring was continued. After 4 hours, the mixture was increased in temperature up to 75° C., and kept for another hour. After the completion of the reaction, the reaction solution was cooled down to room temperature, and poured into 400 ml of water. The deposited solid was filtered out, and dried. This resulted in a fluoroaliphatic group-containing compound P-2 with a yield of 68.4 g. This solid was found to be a high molecular weight compound with a weight-average molecular weight of 30000 by GPC.

Compound (a) of Synthetic Example 1

$$CH_2=CH-\underset{\underset{O}{\|}}{C}-OCH_2CH_2NSO_2C_8F_{17}$$
$$\qquad\qquad\qquad\qquad |$$
$$\qquad\qquad\qquad\qquad Pr$$

Compound (b) of Synthetic Example 1

$$CH_2=CH-\underset{\underset{O}{\|}}{C}-NH-\!\!\left\langle\!\!\!\bigcirc\!\!\!\right\rangle\!\!-SO_2NH-\!\!\left\langle\!\!\!\bigcirc\!\!\!\right\rangle\!\!(H_3C)_2$$

Synthetic Example 2

A fluoroaliphatic group-containing compound P-15 (weight-average molecular weight 25000) was obtained in the same manner as with Synthetic Example 1, except that the structural units (1), (2), and (3) of Synthetic Example 1 were changed. The following treatments were continuously carried out using a JIS A 1050 aluminum plate with a thickness of 0.24 mm and a width of 1030 mm.

(a) While feeding a suspension of abrasive (pumice) in water, having a specific gravity of 1.12 as an abrasive slurry solution to the surface of the aluminum plate, mechanical roughening was carried out by means of a rotating roller-like nylon brush. The abrasive had an average grain size of 40 to 45 $\mu$m and a maximum grain diameter of 200 $\mu$m. The material of the nylon brush was 6·10 nylon. The hair length was 50 mm and the hair diameter was 0.3 mm. In the nylon brush, hairs were implanted densely into holes bored on a 300 mm-dia$\phi$ stainless tube. Three rotary brushes were used. The distance between two supporting rollers (diameter$\phi$200 mm) at the lower part of the brushes was 300 mm. The brush rollers were pressed until the load of a driving motor for rotating the brushes increases by 7 kw relative to the load before pressing of the brush rollers onto the aluminum plate. The direction of rotation of the brushes was the same as the direction of movement of the aluminum plate. The number of revolutions thereof was 200 rpm.

(b) The aluminum plate was subjected to an etching treatment by means of spraying with a caustic soda concentration of 2.6 mass % and an aluminum ion concentration of 6.5 mass %, at a temperature of 70° C. As a result, the aluminum plate was dissolved in an amount of 13 g/m². Then, water washing by means of spraying was carried out.

(c) A desmutting treatment was carried out by spraying with an aqueous solution having a nitric acid concentration of 1 mass % at a temperature of 30° C. (containing aluminum ions in an amount of 0.5 mass %), and then, water washing was carried out by means of spraying. As the nitric acid aqueous solution used for the desmutting, the waste solution of the step of performing electrochemical surface roughening with alternating current in a nitric acid aqueous solution was used.

(d). An electrochemical surface roughening treatment was continuously carried out using 60 Hz AC voltage. The electrolyte at this step was a 1 mass % aqueous solution of nitric acid (containing aluminum ions in an amount of 0.5 mass %, and ammonium ions in an amount of 0.007 mass %), and had a temperature of 50° C. For an a.c. power waveform, a trapezoidal square alternating current having a time TP required for current value to reach from zero to peak of 2 msec and a duty ratio of 1:1 was used. Thus, an electrochemical surface roughening treatment was carried out with a carbon electrode as a counter electrode. The auxiliary anode used was ferrite. Two electrolytic cells were used in this step. The current density in terms of the current peak value was 30 A/dm², and the quantity of electricity was 180 C/dm² in terms of the total sum of the quantity of electricity when the aluminum plate served as an anode. Five percent of the current flown from the power source was diverted into the auxiliary anode. Thereafter, water washing by means of spraying was carried out.

(e) The aluminum plate was subjected to an etching treatment by means of spraying with a caustic soda concentration of 26 mass % and an aluminum ion concentration of 6.5 mass % at 70° C. As a result, the aluminum plate was dissolved in an amount of 1.3 g/m², and the smut component mainly comprising aluminum hydroxide produced upon performing the electrochemical surface roughening using alternating current of the previous stage was removed, and the edge parts of pits produced were dissolved to smooth the edge parts. Thereafter, water washing by means of spraying was carried out.

(f) A desmutting treatment by means of spraying was carried out with an aqueous solution having a sulfuric acid concentration of 25 mass % (containing aluminum ions in an amount of 0.5 mass % at a temperature of 60° C., and then, water washing was carried out by means of spraying.

(g) By the use of an anodic oxidation apparatus of a two-stage power supply electrolytic treatment process (first and second electrolysis unit lengths: 6m for each, first power supply unit length, 3 m, second power supply unit length, 3 m, and first and second power supply electrode lengths, 2.4 m for each), an anodic oxidation treatment was carried out at a sulfuric acid concentration of the electrolyte unit of 100 g/l (containing aluminum ions in an amount of 0.5 mass %), a temperature of 50° C., a specific gravity of 1.1, and an electric conductivity of 0.39 S/cm. Then, water washing was carried out by means of spraying. The final oxide film amount was 2.4 g/m².

(h) The plate subjected to the surface roughening and anodic oxidation treatments was immersed in a 0.1 mass % aqueous solution of sodium silicate solution for 10 seconds at 20° C. then washed with water by means of spraying and dried. After each treatment and water washing, drainage was carried out by means of nip rollers.

The back surface of the plate was coated with the following diluted sol-gel reaction solution by a bar coater, and dried at 100° C. for 1 minute, thereby to provide a back coat layer in a coating amount after drying of 60 mg/m².

Sol-gel reaction solution Tetraethyl silicate 50.0 parts by mass, Water 86.4 parts by mass, Methanol 10.8 parts bypass, and Phosphoric acid (85%) 0.08 parts by mass: the components described above were mixed with stirring, and produced heat in about 35 minute. The mixture was reacted with stirring for 40 minutes, and then, further mixed with the following diluent, thereby to prepare a back coat coating solution.

Diluent Pyrogallol-acetone condensed resin 15.0 parts by mass, Dibutyl maleate 5.0 parts by mass, Methanol silica sol (manufactured by NISSAN CHEMICAL INDUSTRIES, Ltd.) 70.0 parts by mass, Megafac F-177 (manufactured by Dai-Nippon Ink &. Chemicals Inc.) 0.1 parts by weight, Methanol 650 parts by mass, and 1-Methoxy-2-propanol 200 parts by mass Then, onto the surface of the plate having the back coat provided thereon, an organic intermediate layer coating solution was coated by means of a bar coater, and dried at 100° C. for 10 seconds, thereby to provide an organic intermediate layer in a coating amount after drying of 7 mg/m².

Organic intermediate layer coating solution composition Compound A (number-average molecular weight 2100) 0.15 part by mass, Salicylic acid 0.02 part by mass, Methanol 100.0 parts by mass, and Water 1.0 part by mass

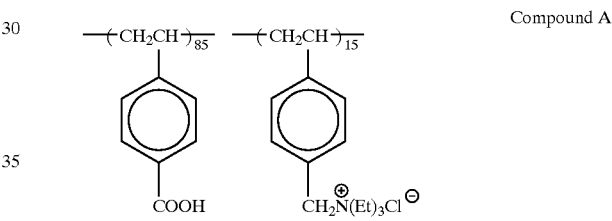

Compound A

Numerical value is expressed in terms of mol %

Then, onto the surface of the plate having the organic intermediate layer provided thereon (organic intermediate layer), the following photosensitive solution was coated by means of a bar coater, and dried at 100° C. for 60 seconds. The coating amount after drying was 1.15 g/m².

Photosensitive solution 1 Esterified product of 1,2-diazonaphthoquinone-5-sulfonyl chloride and pyrogallol-acetone resin (the one described in Example 1 of U.S. Pat. No. 3,635,709) 0.8 part by mass, Cresol-formaldehyde novolak resin (meta to para ratio 6:4, weight-average molecular weight 8000, number-average molecular weight 2700, residual cresol 0.8%) 1.2 parts by mass, Phenol-formaldehyde novolak resin (weight-average molecular weight 10000, number-average molecular weight 1400, residual phenol 0.8%) 0.5 part by weight, Other resins than novolak (the following structural formula, weight-average molecular weight 50000) 0.5 part by mass, Naphthoquinone-1,2-diazide-4-sulfonic acid chloride 0.1 part by mass, Tetrahydroxyphthalic anhydride 0.2 part by mass, 4-[P-N-(P-hydroxybenzoyl)aminophenyl]-2,6-bis(trichloromethyl)-S-triazine 0.1 part, by mass, Victoria Blue BOH (a dye in which the counter anion was changed to naphthalene sulfonic acid, manufactured by HODOGAYA CHEMICAL Co., Ltd.) 0.1 part by mass, Dye of the following formula (I) 0.04 part by mass, Methyl ethyl ketone 30 parts by mass, 1-Methoxy-2-propanol 15.0 parts by mass, Fluorine-containing high molecular weight compound (i) (Chemical Formula 7) 0.05 part by mass, Fluorine-containing high molecular compound (ii) (Chemical Formula 7) 0.05 part by mass, and Fluorine-containing high molecular weight compound (iii) (Chemical Formula 7) 0.01 part by mass
Resins other than novolak
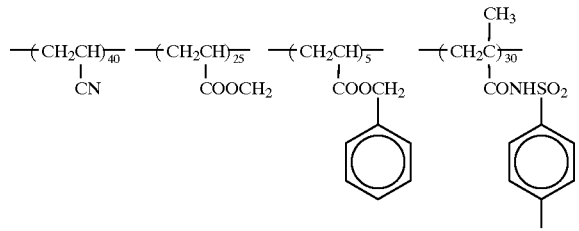
Note) Mw: 50000; and the numerical value is expressed in terms of mol %
Dye (I)
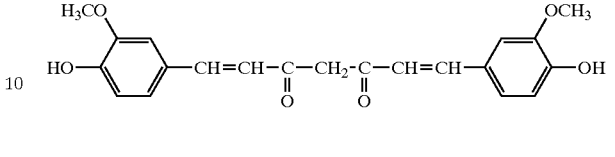
Fluorine-containing high molecular weight compound
P-5
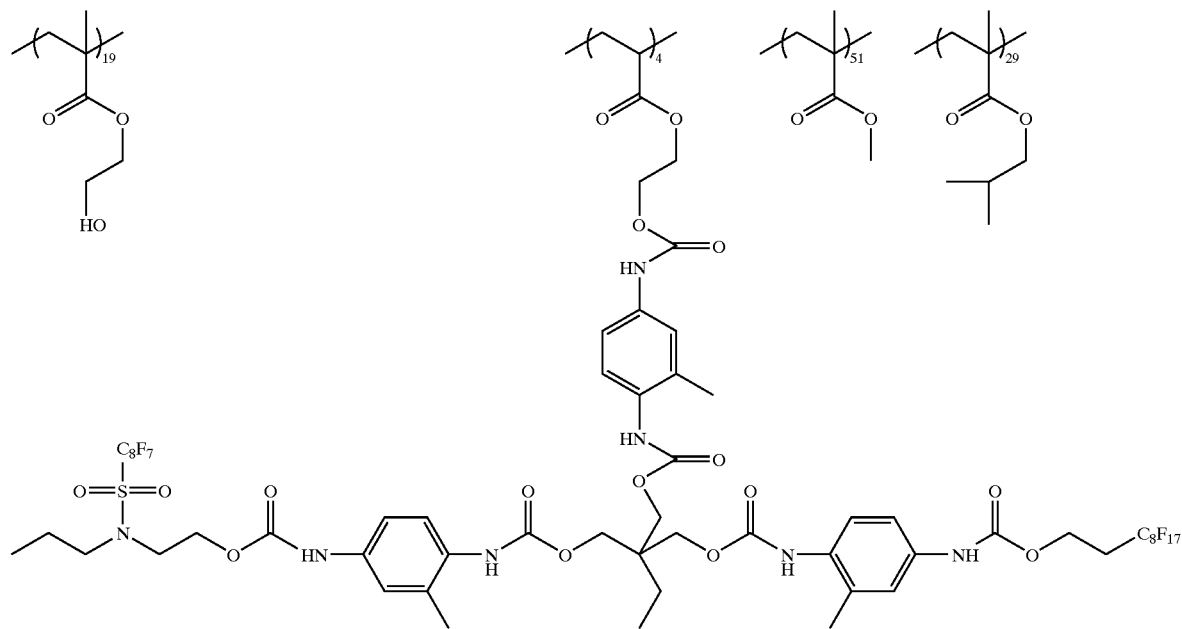
P-2
(i)
(ii)
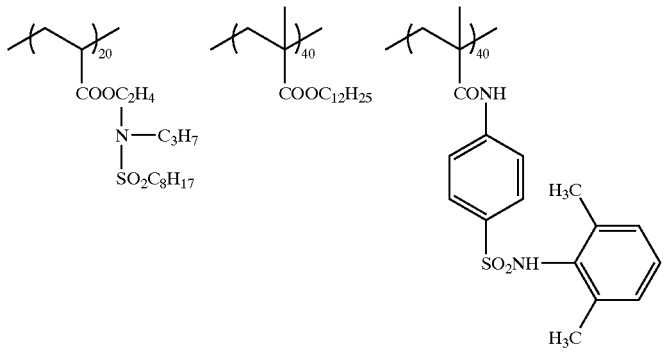

Mw: 40000; and the numerical value is expressed in terms of mol %

C-4

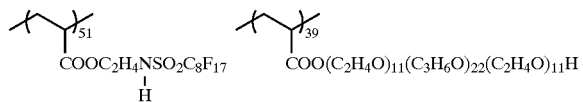

Onto the surface of the photosensitive layer thus provided, a mat layer forming resin solution was sprayed in the following manner to form a mat layer. As a mat layer forming resin, there was prepared a 12% aqueous solution of methyl methacrylate/ethyl acrylate/acrylic acid (charging mass ratio 65:20:15) copolymer, which had been partially converted into sodium salt (in some cases, into a potassium salt or an ammonium salt). The solution was coated by means of a rotary atomizing electrostatic coating machine. The number of revolutions of an atomizing head was 15,000 rpm, the feed rate of the resin solution was 65 ml/minute, the applied voltage to the atomizing head was −75 kV, the ambient temperature during coating was 25° C., and the relative humidity was 50%. After 1.5 seconds from coating, the coated surface was sprayed with vapor, and wetted. Then, after 3 seconds from wetting, warm air with a temperature of 60° C. and a humidity of 10% was blown thereon for 5 seconds for drying. The coating amount of this mat layer was 130 mg/m².

The photosensitive plate obtained was subjected to image exposure for 1 minute with a printer FT26V2UPNS manufactured by NuArc Co., Inc., in USA (light source: a 2 kW metal halide lamp). Evaluation of the developer sensitivity was carried out using the photosensitive plate onto which the image of Stepwedge (difference in density between respective steps being 0.15) manufactured by Fuji Photo Film Co., Ltd., has been exposed under the foregoing conditions.

[Photosensitive plate D]

The surface of a 0.24 mm-thick aluminum plate of 1S material was grained with a nylon brush and an aqueous suspension of 400-mesh pumice stone, and well washed with water. This was immersed in a 20% aqueous solution of sodium hydroxide at 70° C. for 60 seconds, and etched. Then, the plate was washed with running water, followed by neutralization and washing with a 20% nitric acid. Thereafter, using a sine wave a.c. waveform current with $V_A$=12.7 V and $V_C$=9.1 V, an electrolytic surface roughening treatment was carried out in a 1% nitric acid aqueous solution with a quantity of electricity at the anode period of 170 coulomb/dm². This plate was immersed in a 25% sodium hydroxide aqueous solution at 45° C. for 15 seconds, and etched. Subsequently, it was immersed in a 30% sulfuric acid aqueous solution, and desmutted at 55° C. for 2 minutes, and then, subjected to an anodic oxidation treatment in a 7% sulfuric acid aqueous solution so that the coating amount of aluminum oxide was 1.8 g/m². Thereafter, the plate was subjected to an immersion treatment in a 3% aqueous solution of sodium silicate at 70° C. for 1 minute, followed by water washing and drying. This resulted in an aluminum plate whose surface had been subjected to a hydrophilization treatment.

The aluminum plate obtained in the foregoing manner was first coated with the following photosensitive solution (A) by means of a bar coater, and dried at 80° C. for 30 seconds. The plate was obtained in a dry weight of 0.1 g/m².

Photosensitive Solution (A)

Polyurethane rein (weight-average molecular weight 100000) of 4,4'-diphenylmethane diisocyanate/hexamethylene diisocyanate/2,2-bis(hydroxymethyl) propionic acid/tetraethylene glycol=50/50/90/10 (molar ratio) (hereinafter, referred to as polyurethane resin a1) 1.0 g, Copolycondensed diazo resin of 4-diazo-3-methoxydiphenylamine dodecylbenzene sulfonic acid salt/phenoxyacetic acid=5/5 (molar ratio) (hereinafter, referred to as diazo resin b1) 0.3 g, Megafac F-176 (fluorine-containing surfactant manufactured by Dai-Nippon ink & Chemicals Inc.) 0.05 g, Methyl ethyl ketone 50 g, and Methanol 50 g The plate obtained in the foregoing manner was further coated with the following photosensitive solution (C) by means of a bar, and dried at 100° C. for 1 second. The total dry weight including the amount of the photosensitive solution (A) coated was 1.0 g/m².

Photosensitive Solution (C)

Copolymer of N-[6-(methacryloyloxy) hexyl]-2,3-dimethyl maleimide/methacrylic acid=60/40 (mol) 5.0 g, Sensitizer of the following structure 0.3 g, Copolycondensed diazo resin of 4-diazo-3-methoxydiphenylamine dodecylbenzene sulfonic acid salt/phenoxyacetic acid=5/5 (molar ratio) (hereinafter, referred to as diazo resin c1) 0.3 g, Hexafluorophosphoric acid salt of 4-diazo-3-methoxydiphenylamine 0.2 g, Victoria PureBlue BOH (manufactured by HODOGAYA CHEMICAL Co., Ltd.) 0.1 g, Megafac F-177 (fluorine-containing surfactant manufactured by Dai-Nippon Ink & Chemicals Inc.) 0.1 g, Propylene glycol monomethyl ether 50 g, Methyl ethyl ketone 50 g, and Methanol 20 g

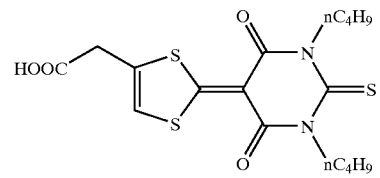

The photosensitive plate obtained was subjected to 200-count image exposure with a printer FT26V2UPNS manufactured by NuArc Co., Inc., in USA (light source: a 2 kW metal halide lamp). Evaluation of the developer sensitivity was carried out using the photosensitive plate onto which the image of a step wedge (difference in density between respective steps being 0.15) manufactured by Fuji Photo Film Co., Ltd., has been exposed under the foregoing conditions.

[Photosensitive Plate E]

Preparation was carried out based on Example 1 of JP-A-11-119419. The photosensitive plate obtained was subjected to image exposure by means of a plate setter Luxcel Platesetter 9000 CTP (manufactured by Fuji Photo Film Co., Ltd.) (output power 216 mW, number of revolutions 1000 rpm, resolution 2438 dpi, and image area proportion about 20%). Evaluation of the developer sensitivity was carried out with a photosensitive plate subjected to exposure by changing the exposure from 27 mW (13.5 mJ/cm²) to 270 mW (135 mJ/cm²) in increments of 13.5 mW (6.75 mJ/cm²) using an original pattern of Luxcel Platesetter 9000 CTP. Namely, the stepwise exposure was carried out with exposures varying from 10% to 100% in increments of 5% of the maximum value of the plate surface energy. This indicates that the difference in plate surface energy between adjacent exposed portions is 5 to 50%.

[Photosensitive Plate F]

Preparation was carried out based on Example 1 of JP-A-2000-284474.

[Photosensitive Plate G]

[Preparation of support] A molten metal of JIS A1050 alloy containing 99.5% or more of aluminum, 0.30% of iron, 0.10% of silicon, 0.02% of titanium, and 0.013% of copper was subjected to a purification treatment, and cast. In the purification treatment, a degassing treatment was carried out for removing unnecessary gases such as hydrogen in the molten metal, and a ceramic tube filter treatment was carried out. Casting was accomplished by a DC casting method. The solidified ingot with a plate thickness of 500 mm was machined to a depth of 100 mm from the surface, and subjected to a homogenization treatment at 550° C. for 10 hours so as to prevent the intermetallic compound from increasing in size too much. Then, the ingot was hot rolled at 400° C., and subjected to an intermediate annealing in a continuous annealing furnace at 500° C. for 60 seconds, followed by cold rolling. This resulted in an aluminum rolled plate with a plate thickness of 0.30 mm. By controlling the surface roughness of the reduction roll, the center line average height Ra was controlled to 0.2 μm. Thereafter, the plate was further treated in a tension leveler in order to improve its flatness.

Next, a surface treatment for implementing a lithographic printing plate was carried out. First, a degreasing treatment was carried out with a 10% sodium aluminate aqueous solution at 50° C. for 30 seconds in order to removing the rolling oil on the aluminum plate surface. Then, neutralization and desmutting treatments were carried out with a 30% sulfuric acid aqueous solution at 50° C. for 30 seconds.

Then, a so-called graining treatment for roughening the surface of the support was carried out in order to achieve a favorable adhesion between the support and the photosensitive layer, and to impart water retentivity to non-image portions. An aqueous solution containing 1% nitric acid and 0.5% aluminum nitrate was kept at 45° C. While drifting the aluminum web in the aqueous solution, electrolytic graining was carried out by providing an electrical quantity of 240 C/dm$^2$ on the anode side with a current density of 20 A/dm$^2$ and an a.c. waveform having a duty factor of 1:1 by means of an indirect feed cell. Thereafter, an etching treatment was carried out in a 10% sodium aluminate aqueous solution at 50° C. for 30 seconds, and neutralization and desmutting treatments were carried out with a 30% sulfuric acid aqueous solution at 50° C. for 30 seconds.

Furthermore, an oxide film was formed on the support by anodic oxidation in order to improve the abrasion resistance, the chemical resistance, and the water retentivity. A 20% aqueous solution of sulfuric acid was used at 35° C. as an electrolyte. While passing the aluminum web through the electrolyte, an electrolysis treatment was carried out with a direct current of 14 A/dm$^2$ by means of an indirect feed cell. This resulted in the formation of an anodic oxide film of 2.5 g/m$^2$. Thereafter, a silicate treatment was carried out in order to ensure the hydrophilicity for the non-image portions of a printing plate. The treatment was carried out in the following manner. A 1.5% aqueous solution of No. 3 silicate of soda was kept at 70° C., and the aluminum web was allowed to pass through the solution so that the contact time thereof was 15 seconds, and further washed with water. The amount of Si deposited was 10 mg/m$^2$. The Ra (centerline average surface height) of the support prepared in the foregoing manner was 0.25 μm.

[Undercoating]

Next, the aluminum support was coated with the following undercoating solution by a wire bar, and dried at 90° C. for 30 seconds by means of a warm air drier. The coating amount after drying was 10 mg/m$^2$.

<Undercoating Solution>

Copolymer of an ethyl methacrylate and 2-acrylamide-2-methyl-1-propanesulfonic acid sodium salt with a molar ratio of 75:15 0.1 g/2-Aminoethyl phosphonic acid 0.1 g/Methanol 50 g/Ion exchange water 50 g

[Photosensitive Layer]

Then, the following photosensitive layer coating solution [P] was prepared, and coated onto the foregoing undercoated aluminum plate with a wire bar. The plate was dried at 115° C. for 45 seconds by means of a warm air drier to form a photosensitive layer, thereby to obtain a photosensitive plate. The coating amount after drying was within the range of 1.2 to 1.3 g/m$^2$ <Photosensitive Layer Coating Solution [P]>

Infrared absorber [IR-6] 0.08 g/Onium salt [OI-6] 0.30 g/Dipentaerythritol hexaacrylate 1.00 g/Copolymer of allyl methacrylate and methacrylic acid with a molar ratio of 80:20 (weight average molecular weight: 120,000) 1.00 g/Naphthalene sulfonic acid salt of Victoria Pure Blue 0.04 g/Fluorine-containing surfactant (MEGAFAC F-176, manufactured by Dai-Nippon Ink & Chemicals Inc.) 0.01 g/Methyl ethyl ketone 9.0 g/Methanol 10.0 g/1-Methoxy-2-propanol 8.0 g

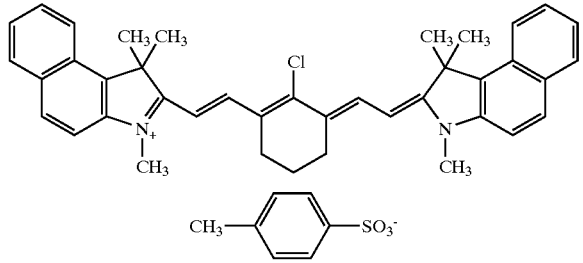

[IR-6]

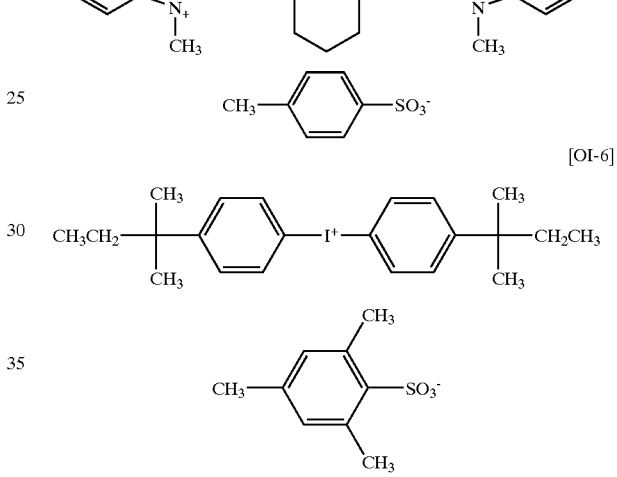

[OI-6]

The photosensitive plate obtained was subjected to image exposure by means of a Trendsetter 3244VFS, manufactured by Creo Corp, equipped with a water cooling type 40 W infrared semiconductor laser under the conditions of an output of 90 W, a number of revolutions of external drum of 210 rpm, a plate surface energy of 100 mJ/cm$^2$, and a resolution of 2,400 dpi.

[Photosensitive Plate H]

Preparation was carried out based on Example 1 of JP-A-2000-039724. The photosensitive plate obtained was subjected to an image exposure using a platesetter: Gutenberg (manufactured by Heidelberg Co.) (scanning exposure angle: 180 degrees) under the conditions of a light quantity on the plate surface of 0.2 mJ/m$^2$ and 2400 dpi. After exposure, the plate was further heated at 100° C. for another minute. Evaluation of the developer sensitivity was carried out using a photosensitive material exposed through a film of Stepwedge manufactured by Fuji Photo Film Co., Ltd., (difference in density between respective steps being 0.15) bonded at the position of the solid image portion thereof.

[Photosensitive plate I]

Preparation was carried out based on Example 15 of JP-A-11-352691.

The photosensitive plate obtained was subjected to image exposure by means of a scanning exposure system using a 75 mW air-cooled Ar laser as a light source with an exposure of 0.20 mJ/m$^2$ on the plate surface. After exposure, the plate was further heated at 100° C. for another minute. Evaluation of the developer sensitivity was carried out using a photosensitive material exposed through a Step Tablet (manufactured by Fuji Photo Film Co., Ltd.), which decreases in light quantity in decrements of 1/1.4 for each step increase, contacted therewith at a plate surface illuminance of 0.0132 mV/cm² for 30 seconds.

[Photosensitive Plate J]

[Support]

(Support: Anodic oxidized aluminum support) The surface of a 0.30 mm-thick aluminum plate of 1S material was grained with a No. 8 nylon brush and an aqueous suspension of 800-mesh pumice stone, and well washed with water. This was immersed in a 10% sodium hydroxide at 70° C. for 60 seconds, and etched. Then, the plate was washed with running water, followed by neutralization and washing with a 20% HNO₃, and water washing. Using a sine wave a.c. waveform current under the condition of $V_A$=12.7 V, an electrolytic surface roughening treatment was carried out in a 1% nitric acid aqueous solution with a quantity of electricity at the anode period of 300 coulomb/dm². The surface roughness thereof was measured, and found to be 0.45 µm (expressed in terms of Ra). Subsequently, the plate was immersed in a 30% H₂SO₄ aqueous solution, and desmutted at 55° C. for 2 minutes. Then, the plate was subjected to anodic oxidation with a cathode placed on the grained surface in a 20% H₂SO₄ aqueous solution at 33° C. at a current density of 5 A/dm² for 50 seconds, resulting in a thickness of 2.7 g/m². Further, the following undercoating liquid composition for surface treatment was coated so that the P amount was about 0.05 g/m², followed by drying at 100° C. for 1 minute.

<Undercoating Liquid Composition>

Phenyl phosphonic acid 2 parts by weight, Methanol 800 parts by weight, and Water 50 parts by weight

[Photosensitive Material]

On the support, a photopolymerizable composition of the following composition was coated so that the dry coating weight was 1.5 g/m², followed by drying at 100° C. for 1 minute, thereby to form a photosensitive layer. Subsequently, on the photosensitive layer, a 3 wt % aqueous solution of polyvinyl alcohol (degree of saponification 98 mol %, degree of polymerization 500) was coated so that the dry coating weight was 2.5 g/m², followed by drying at 120° C. for 3 minutes, thereby to form a photosensitive plate-making printing plate (photosensitive material).

(Photosensitive Coating Solution (Photopolymerizable Composition))

Ethylenically unsaturated bond-containing compound (A) 1.7 parts by weight, Linear organic high molecular weight polymer (B) 1.9 parts by weight, Sensitizer (C) 0.15 parts by weight, Photoinitiator (D) 0.30 part by weight, Additive (S) 0.50 part by weight, Fluorine-containing surfactant 0.03 part by weight (Megafac F-177, manufactured by Dai-Nippon Ink & Chemicals Inc.), Thermal polymerization inhibitor 0.01 part by weight, (N-nitrosohydroxylamine aluminum salt) ε type copper phthalocyanine dispersion 0.2 part by weight, Methylethyl ketone 30.0 parts by weight, and Propylene glycol monomethyl ether 30.0 parts by weight Incidentally, the ethylenically unsaturated bond-containing compound (A), the linear organic high molecular weight polymer (B), the sensitizer (C), the photoinitiator (D), and the additive (S), to be used for the photosensitive layer coating solution will be shown below.

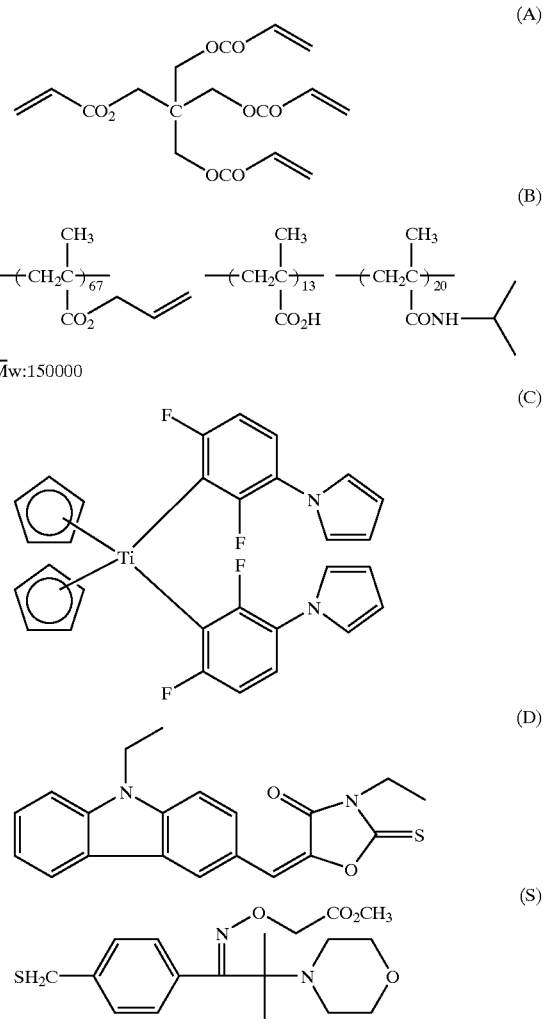

The photosensitive plate obtained was subjected to image exposure under the condition of a resolution: 4000 dpi by means of a 532-nm and 100-mW FD/YAG laser (Platejet 4 manufactured by CSI company). After exposure, the plate was further heated at 100° C. for another minute. Evaluation of the developer sensitivity was carried out using a photosensitive material exposed through a film of Stepwedge manufactured by Fuji Photo Film Co., Ltd., (difference in density between respective steps being 0.15) bonded at the position of the solid image portion thereof.

[Photosensitive Plate K]

The surf ace of a 0.30 mm-thick aluminum plate of 1S material was grained with a No. 8 nylon brush and an aqueous suspension of 800-mesh pumice stone, and then well washed with water. This was immersed in a 10% sodium hydroxide at 70° C. for 60 seconds, and etched. Then, the plate was washed with running water, followed by neutralization and washing with a 20% nitric acid, and water washing. Using a sine wave a.c. waveform current under the condition of $V_A$=12.7 V, an electrolytic surface roughening treatment was carried out in a 1% nitric acid aqueous solution with a quantity of electricity at the anode period of 300 coulomb/dm². The surface roughness thereof was measured, and found to be 0.45 µm (expressed in terms of Ra). Subsequently, the plate was immersed in a 30% H₂SO₄ aqueous solution, and desmutted at 55° C. for 2 minutes. Then, the plate was subjected to anodic oxidation with a cathode placed on the grained surface in a 20% H₂SO₄ aqueous solution at 33° C. at a current density of 5 A/dm² for 50 seconds, resulting in a thickness of 2.7 g/m². Onto the aluminum plate thus treated, a high sensitivity photopolymerizable composition 1 of the following composition was coated so that the dry coating weight was 1.5 g/m², followed by drying at 100° C. for 1 minute. As a result, a photosensitive layer was formed.

(Photopolymerizable Composition 1)

Ethylenically unsaturated bond-containing compound (A1) 1.5 parts by weight, Linear organic high molecular weight polymer (B1) 2.0 parts by weight, Sensitizer (C1) 0.15 parts by weight, Photoinitiator (D1) 0.2 part by weight, α-phthalocyanine (F1) dispersion 0.02 part by weight, Fluorine-containing nonionic surfactant Megafac F-177, 0.03 part by weight (manufactured by Dai-Nippon Ink & Chemicals Inc.), Methyl ethyl ketone 9.0 parts by weight, Propylene glycol monomethyl ether acetate 7.5 parts by weight, and Toluene 11.0 parts by weight

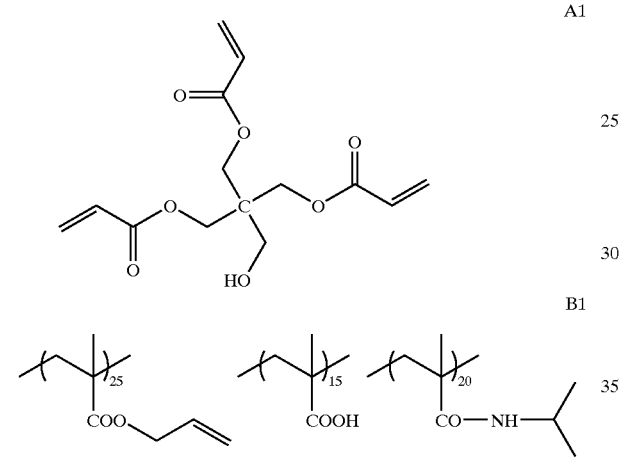

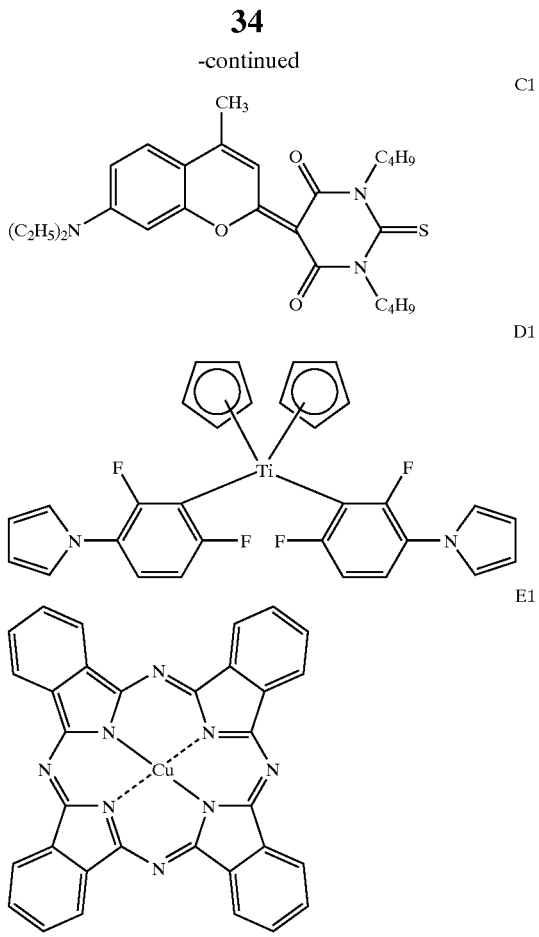

[Treatments of Examples 1 and 2]

As shown in Tables 1 to 6, the developer sensitivity stability was evaluated by carrying out continuous treatments using the replenishing method of the invention. The results are shown in Tables 7 and 8.

TABLE 1

|  | Method | Photosensitive material | Developer | Replenisher | TC |
|---|---|---|---|---|---|
| Ex. 1 | Inventive | PM E | De B | Re B | TC 4 |
| Ex. 2 | Inventive | PM A, PM B | De A | Re A | TC 1 |
| Ex. 3 | Inventive | PM A, PM B, PM E | De B | Re B | TC 2 |
| Ex. 4 | Inventive | PM C, PM D, PM E | De B | Re B | TC 3 |
| Ex. 5 | Inventive | PM F | De C | Re C | TC 4 |
| Ex. 6 | Inventive | PM G | De E | Re E | TC 4 |
| Ex. 7 | Inventive | PM K | De E | Re E | TC 5 |
| Ex. 8 | Inventive | PM H | De D | Re D | TC 6 |
| Ex. 9 | Inventive | PM I | De D | Re D | TC 7 |
| Ex. 10 | Inventive | PM J | De E | Re E | TC 8 |
| CE. 1 | Conductivity-based | PM E | De A | Re A | TC 4 |
| CE. 2 | Conductivity-based | PM A, PM B | De B | Re B | TC 1 |
| CE. 3 | Area- & time-based | PM A, PM B, PM E | De B | Re B | TC 9 |
| CE. 4 | Area- & time-based | PM C, PM D, PM E | De B | Re B | TC 10 |
| CE. 5 | Area- & time-based | PM F | De C | Re C | TC 11 |

TABLE 1-continued

|  | Method | Photosensitive material | Developer | Replenisher | TC |
|---|---|---|---|---|---|
| CE. 6 | Area- & time-based | PM G | De E | Re E | TC 12 |
| CE. 7 | Area- & time-based | PM K | De E | Re E | TC 13 |
| CE. 8 | Area- & time-based | PM H | De D | Re D | TC 14 |
| CE. 9 | Area- & time-based | PM I | De D | Re D | TC 15 |
| CE. 10 | Area- & time-based | PM J | De E | Ro E | TC 16 |

Note:
Method denotes Replenishing method;
CE, Comparative Example;
Inventive, Inventive method;
Conductivity-based, Electric conductivity-based replenishing method;
Area- & time-based, Area- and time-based replenishing method;
PM, Photosensitive material;
De, Developer;
Re, Replenisher; and
TC, Treatment Conditions.

TABLE 2

|  | ADA | D Temp | D Time | DTV | TS | Amount 1 | Amount 2 | Amount 3 | TP |
|---|---|---|---|---|---|---|---|---|---|
| TC 1 | FIG. 3 | 30° C. | 12 sec | 20000 cc | 1400 mm/min | — | — | — | Table 4 |
| TC 2 | FIG. 1 | 30° C. | 12 sec | 20000 cc | 1400 mm/min | — | — | — | Table 5 |
| TC 3 | FIG. 1 | 30° C. | 12 sec | 20000 cc | 1400 mm/min | — | — | — | Table 6 |
| TC 4 | FIG. 1 | 30° C. | 12 sec | 20000 cc | 1400 mm/min | — | — | — | Table 3 |
| TC 5 | FIG. 1 | 30° C. | 15 sec | 20000 cc | 1100 mm/min | — | — | — | Table 3 |
| TC 6 | FIG. 1 | 30° C. | 20 sec | 20000 cc | 800 mm/min | — | — | — | Table 3 |
| TC 7 | FIG. 1 | 25° C. | 20 sec | 20000 cc | 800 mm/min | — | — | — | Table 3 |
| TC 8 | FIG. 1 | 30° C. | 15 sec | 20000 cc | 1100 mm/min | — | — | — | Table 3 |
| TC 9 | FIG. 1 | 30° C. | 12 sec | 20000 cc | 1400 mm/min | 50 cc/h | 15 cc/h | 20 cc/m$^2$ | Table 5 |
| TC 10 | FIG. 1 | 30° C. | 12 sec | 20000 cc | 1400 mm/min | 50 cc/h | 15 cc/h | 20 cc/m$^2$ | Table 6 |
| TC 11 | FIG. 1 | 30° C. | 12 sec | 20000 cc | 1400 mm/min | 147 cc/h | 74 cc/h | 17 cc/m$^2$ | Table 3 |
| TC 12 | FIG. 1 | 30° C. | 12 sec | 20000 cc | 1400 mm/min | 70 cc/h | 30 cc/h | 100 cc/m$^2$ | Table 3 |
| TC 13 | FIG. 1 | 30° C. | 15 sec | 20000 cc | 1100 mm/min | 70 cc/h | 30 cc/h | 100 cc/m$^2$ | Table 3 |
| TC 14 | FIG. 1 | 30° C. | 12 sec | 20000 cc | 800 mm/min | 100 cc/h | 75 cc/h | 75 cc/m$^2$ | Table 3 |
| TC 15 | FIG. 1 | 25° C. | 12 sec | 20000 cc | 800 mm/min | 90 cc/h | 40 cc/h | 70 cc/m$^2$ | Table 3 |
| TC 16 | FIG. 1 | 30° C. | 15 sec | 20000 cc | 1100 mm/min | 70 cc/h | 30 cc/h | 100 cc/m$^2$ | Table 3 |

Note:
TC denotes Treatment conditions;
ADA, Automatic developing apparatus;
D Temp, Development temperature;
D Time, Development time;
DTV, Developer tank volume;
TS, Transfer speed;
Amount 1, Time-based replenishing amount during operation;
Amount 2, Time-based replenishing amount during stop;
Amount 3, Treatment-based replenishing amount; and
TP, Treatment pattern.

TABLE 3

Treatment amount of each day

| Date | 1 | 2 | 3 | 6 | 7 | 8 | 9 | 10 | 13 | 14 |
|---|---|---|---|---|---|---|---|---|---|---|
| Day of the week | Mon | Tu. | Wed. | Th. | Fri. | Mon. | Tu. | Wed. | Th. | Fri. |
| P |  |  |  |  |  |  |  |  |  |  |
| AM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 |
| PM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 |
| Total (m$^2$) | 21 | 21 | 21 | 67 | 11 | 11 | 11 | 11 | 11 | 6 |

Note:
P denotes Photosensitive material (m$^2$ × number of sheets).

TABLE 4

Treatment amount of each day

| | Date | | | | | | | | | |
|---|---|---|---|---|---|---|---|---|---|---|
| | 1 | 2 | 3 | 6 | 7 | 8 | 9 | 10 | 13 | 14 |
| | Day of the week | | | | | | | | | |
| | Mon | Tu. | Wed. | Th. | Fri. | Mon. | Tu. | Wed. | Th. | Fri. |
| P A | | | | | | | | | | |
| AM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| PM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| P B | | | | | | | | | | |
| AM | 0 | 0 | 0 | 0 | 0 | 0.8 × 7 | 0 | 0.8 × 7 | 0 | 0 |
| PM | 0 | 0 | 0 | 0 | 0 | 0.8 × 7 | 0 | 0.8 × 7 | 0 | 0 |
| Total (m$^2$) | 21 | 21 | 21 | 67 | 11 | 11 | 11 | 11 | 11 | 6 |

Note:
P A denotes Photosensitive material A (m$^2$ × number of sheets), and
P B denotes Photosensitive material A (m$^2$ × number of sheets).

TABLE 5

Treatment amount of each day

| | Day of the week | | | | | | | | | |
|---|---|---|---|---|---|---|---|---|---|---|
| | Mon | Tu. | Wed. | Th. | Fri. | Mon. | Tu. | Wed. | Th. | Fri. |
| P E | | | | | | | | | | |
| AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 |
| PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 |
| P A | | | | | | | | | | |
| AM | 0.8 × 6 | 0.8 × 6 | 0.8 × 6 | 0.8 × 20 | 0.8 × 3 | 0 | 0.8 × 3 | 0 | 0.8 × 3 | 0 |
| PM | 0.8 × 7 | 0.8 × 7 | 0.8 × 7 | 0.8 × 20 | 0.8 × 4 | 0 | 0.8 × 4 | 0 | 0.8 × 4 | 0 |
| P B | | | | | | | | | | |
| AM | 0 | 0 | 0 | 0 | 0 | 0.8 × 3 | 0 | 0.8 × 3 | 0 | 0 |
| PM | 0 | 0 | 0 | 0 | 0 | 0.8 × 4 | 0 | 0.8 × 4 | 0 | 0 |
| Total (m$^2$) | 21 | 21 | 21 | 67 | 11 | 9 | 11 | 9 | 11 | 3 |

Note:
P E denotes Photosensitive material E (m$^2$ × number of sheets);
P A, Photosensitive material A (m$^2$ × number of sheets); and
P B, Photosensitive material B (m$^2$ × number of sheets).

TABLE 6

Treatment amount of each day

| | Day of the week | | | | | | | | | |
|---|---|---|---|---|---|---|---|---|---|---|
| | Mon | Tu. | Wed. | Th. | Fri. | Mon. | Tu. | Wed. | Th. | Fri. |
| P E | | | | | | | | | | |
| AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 |
| PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 |
| P C | | | | | | | | | | |
| AM | 0.8 × 6 | 0.8 × 6 | 0.8 × 6 | 0.8 × 20 | 0.8 × 3 | 0 | 0.8 × 3 | 0 | 0.8 × 3 | 0 |
| PM | 0.8 × 7 | 0.8 × 7 | 0.8 × 7 | 0.8 × 20 | 0.8 × 4 | 0 | 0.8 × 4 | 0 | 0.8 × 4 | 0 |
| P D | | | | | | | | | | |
| AM | 0 | 0 | 0 | 0 | 0 | 0.8 × 3 | 0 | 0.8 × 3 | 0 | 0 |
| PM | 0 | 0 | 0 | 0 | 0 | 0.8 × 4 | 0 | 0.8 × 4 | 0 | 0 |
| Total (m$^2$) | 21 | 21 | 21 | 67 | 11 | 9 | 11 | 9 | 11 | 3 |

Note:
P E denotes Photosensitive material E (m$^2$ × number of sheets);
P C, Photosensitive material C (m$^2$ × number of sheets); and
P D, Photosensitive material D (m$^2$ × number of sheets).

TABLE 7

|  | Developer sensitivity stability |
| --- | --- |
| Example 1 | ○ |
| Comparative Example 1 | x |
| Example 2 | ○ |
| Comparative Example 2 | x |
| Example 3 | ○ |
| Comparative Example 3 | x |
| Example 4 | ○ |
| Comparative Example 4 | x |
| Example 5 | ○ |
| Comparative Example 5 | x |
| Example 6 | ○ |
| Comparative Example 6 | x |
| Example 7 | ○ |
| Comparative Example 7 | x |
| Example 8 | ○ |
| Comparative Example 8 | x |
| Example 9 | ○ |
| Comparative Example 9 | x |
| Example 10 | ○ |
| Comparative Example 10 | x |

Criteria-○: Roughly the same sensitivity as the developer sensitivity at the time of start
Δ: Although variations from the developer sensitivity at the time of start are observed, neither image deterioration nor stain are observed
x: The sensitivity variations exceed the acceptable range, and the highlight portions of the dot image cannot be reproduced, or stains occur at non-image portions.

TABLE 8

|  | Developer sensitivity fluctuation range | Developer Sensitivity fluctuation acceptable range |
| --- | --- | --- |
| Example 1 | −1.0% to +6.0% (Printing plate energy required for exposure) | −10% to +10% |
| Comparative Example 1 | −17.0% to +16.5% (Printing plate energy required for exposure) | −10% to +10% |
| Example 2 | −0.15 step to +0.10 step (Number of steps of Stepwedge) | −0.5 step to +0.5 step |
| Comparative Example 2 | −0.55 step to +0.55 step (Number of steps of Stepwedge) | −0.5 step to +0.5 step |

[Treatments of Examples 3 to 10]

As shown in Table 1, the developer sensitivity stability was evaluated by carrying out continuous treatments using the replenishing method of the invention. The results are shown in Table 7.

[Treatments of Comparative Examples 1 and 2]

As shown in Table 1, the developer sensitivity stability was evaluated by carrying out continuous treatments using the electric conductivity-based replenishing method which is the conventional method. The results are shown in Tables 7 and 8.

[Treatments of Comparative Examples 3 to 10]

As shown in Table 1, the developer sensitivity stability was evaluated by carrying out continuous treatments using the area-and time-based replenishing method. The results are shown in Table 7.

With the foregoing evaluations, it has been possible to confirm that in Examples 1 to 10 using the inventive method, the developer sensitivity falls within the acceptable range in contrast to Comparative Examples 1 to 10, in each of which the developer sensitivity exceeds the acceptable range.

Incidentally, in the foregoing embodiments, two types of replenishment time interval threshold values, and three types of arithmetic expressions for calculating the target electric conductivity value are prepared. This allows the switching between the arithmetic expressions for calculating the target electric conductivity value according to the actual replenishment time interval. However, the numbers of types of the replenishment time interval threshold values and arithmetic expressions prepared in advance are not limited to the numbers adopted in the foregoing embodiments. It is also conceivable that a still larger number of replenishment time interval threshold values and arithmetic expressions than in the foregoing embodiments are prepared to allow more flexible response according to a slight change with time, and the like, during operation of the apparatus.

As described above, the invention provides the following automatic developing method of a photosensitive lithographic printing plate. When a large number of photosensitive lithographic printing plates subjected to an exposure treatment are developed by a developer comprising an aqueous solution containing an electrolyte, the electric conductivity value of the developer is measured in a preset given cycle. When the measured electric conductivity value is lower than the sequentially calculated target electric conductivity value, the developer is replenished with a developer replenisher having a higher electric conductivity value than that of the developer only in a given amount. In this method, when the elapsed time from the previous supply of the developer replenisher exceeds the preset threshold value, a second arithmetic expression is employed. When the elapsed time is the threshold value or less, a first arithmetic expression is employed. Thus, a plurality of arithmetic expressions are switched and used to correct the target electric conductivity value. As a result, it is possible to correct the changes in target electric conductivity value due to treatment frequency (ratio of treatment-based replenishing amount and time-based replenishing amount), and to prevent the error in calculation of the target electric conductivity value caused by the fact that the respective necessary time-based replenishing amounts when the automatic developing apparatus is stopping/operating are different from each other in spite of the simple and low cost apparatus structure. Accordingly, it is possible to implement an automatic development treatment with high sensitivity stability.

This application is based on Japanese patent application JP 2003-003293, filed on Jan. 9, 2003, the entire content of which is hereby incorporated by reference, the same as if set forth at length.

What is claimed is:

1. A method for replenishing a developer of an automatic developing apparatus for photosensitive lithographic printing plates, the method comprising: developing a plurality of photosensitive lithographic printing plates subjected to an image exposure with a developer containing an electrolyte, while measuring an electric conductivity value of the developer; and keeping the developer activity constant in accordance with the measured electric conductivity value of the developer, wherein the method comprises:

preliminarily storing: an electric conductivity value of the developer having a developer activity falling within a proper range as a target electric conductivity value; a plurality of target electric conductivity arithmetic expressions set according to different aging exhaustion conditions; and threshold values of replenishment time interval for determining the target electric conductivity arithmetic expressions;

measuring the electric conductivity value of the developer in a predetermined cycle;

replenishing the developer with a predetermined amount of a developer replenisher when the measured electric conductivity value of the developer is lower than the target electric conductivity value; and measuring the replenishment time interval between the previous replenishment of the developer replenisher and the present replenishment of the developer replenisher;

selecting one of the target electric conductivity arithmetic expressions based on the measured replenishment time interval and the threshold value of replenishment time interval; and updating the target electric conductivity value based on the selected target electric conductivity arithmetic expression and the measured replenishment time interval.

2. The method according to claim 1, wherein the electric conductivity value is measured with a measuring device equipped with a temperature sensor and a temperature compensating circuit.

3. The method according to claim 1, wherein the developer electric conductivity value at the time of first start of the treatment of the automatic developing apparatus is stored as a target electric conductivity value of a developer having an activity within a proper range.

4. The method according to claim 1, wherein one of the target electric conductivity arithmetic expressions is selected, based on the relative magnitudes of the measured replenishment time interval and threshold value of replenishment time interval.

5. The method according to claim 1, wherein a first threshold value Ts1 of replenishment time interval and a second threshold value Ts2 of replenishment time interval are preliminarily stored, and when the measured replenishment time interval T from the previous replenishment is smaller than the first threshold value Ts1 of replenishment time interval, new target electric conductivity value is calculated and updated by a first arithmetic expression expressed by the following equation (1):

$$dn = C1 \times do + C2 \times T + C3 \tag{1}$$

do: Target electric conductivity value before replenishment, dn: New target electric conductivity value, T: Replenishment time interval measured, C1, C2, and C3: Preliminary experimentally set constant.

6. The method according to claim 5, wherein, when the measured replenishment time interval T from the previous replenishment is larger than the first threshold value Ts1 of replenishment time and is smaller than the second threshold value Ts2 of replenishment time interval, new target electric conductivity value is calculated and updated by a second arithmetic expression expressed by the following equation (2):

$$dn = C4 \times do + C5 \times T + C6 \tag{2}$$

do: Target electric conductivity value before replenishment, dn: New target electric conductivity value, T: Replenishment time interval measured, C4, C5, and C6: Preliminary experimentally set constant.

7. The method according to claim 6, wherein, when the measured replenishment time interval T from the previous replenishment is larger than the first threshold value Ts1 of replenishment time and the second threshold value Ts2 of replenishment time interval, new target electric conductivity value is calculated and updated by a third arithmetic expression expressed by the following equation (3):

$$dn = C7 \times do + C8 \tag{3}$$

do: Target electric conductivity value before replenishment, dn: New target electric conductivity value, C7 and C8: Preliminary experimentally set constant.

* * * * *